US012690344B2

(12) United States Patent
Yang et al.

(10) Patent No.: US 12,690,344 B2
(45) Date of Patent: Jul. 21, 2026

(54) DISPLAY DEVICE AND METHOD OF FABRICATING THE SAME

(71) Applicant: Samsung Display Co., LTD., Yongin-si (KR)

(72) Inventors: Shin Hyuk Yang, Yongin-si (KR); Dong Han Kang, Yongin-si (KR); Jee Hoon Kim, Yongin-si (KR); Sung Gwon Moon, Yongin-si (KR); Seung Sok Son, Yongin-si (KR); Woo Geun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 417 days.

(21) Appl. No.: 18/238,550

(22) Filed: Aug. 28, 2023

(65) Prior Publication Data

US 2024/0122006 A1      Apr. 11, 2024

(30) Foreign Application Priority Data

Oct. 11, 2022    (KR) ......................... 10-2022-0130095
Apr. 25, 2023    (KR) ......................... 10-2023-0053950

(51) Int. Cl.
*H10K 59/131*        (2023.01)
*H10K 59/12*        (2023.01)
*H10K 59/122*        (2023.01)

(52) U.S. Cl.
CPC ....... *H10K 59/131* (2023.02); *H10K 59/1201* (2023.02); *H10K 59/122* (2023.02)

(58) Field of Classification Search
CPC . H10K 59/131; H10K 59/1201; H10K 59/122
See application file for complete search history.

(56) References Cited

U.S. PATENT DOCUMENTS 10,403,845  B2    9/2019   Lee et al.
2005/0116292 A1*   6/2005   Koo ...................... H10D 86/00
                                                     257/350

FOREIGN PATENT DOCUMENTS

JP          2008039843  A    2/2008
KR    1020200049223  A    5/2020
            (Continued)

OTHER PUBLICATIONS

International Search Report dated Jan. 15, 2024 in corresponding application No. PCT/KR2023/015372, 3 pages, citing references listed within.

*Primary Examiner* — Dale E Page
*Assistant Examiner* — Wilner Jean Baptiste
(74) *Attorney, Agent, or Firm* — CANTOR COLBURN LLP

(57) ABSTRACT

A display device includes a data conductive layer including a first power line, a passivation layer with a first opening exposing the first power line, a via layer with a second opening partially overlapping the first opening, a pixel electrode on the via layer, a connection electrode in the first and second openings, a pixel-defining film with an opening overlapping the second opening, a light-emitting layer on the pixel-defining film, the pixel electrode and the connection electrode, and a common electrode connected to the first power line. The data conductive layer includes a data base layer, a data main metal layer, and a data capping layer, the first power line includes a wire connection structure, in which the data main metal layer is recessed from sides of the data capping layer, and the common electrode is connected to the data main metal layer in the wire connection structure.

15 Claims, 32 Drawing Sheets

(56)                    References Cited

FOREIGN PATENT DOCUMENTS

| | | | |
|---|---|---|---|
| KR | 102121984 | B1 | 6/2020 |
| KR | 1020210035358 | A | 4/2021 |
| KR | 20210086306 | A | 7/2021 |
| KR | 20210086869 | A | 7/2021 |
| KR | 20210158617 | A | 12/2021 |
| KR | 20220042815 | A | 4/2022 |
| KR | 1020220065949 | A | 5/2022 |
| KR | 20220080492 | A | 6/2022 |

* cited by examiner

FIG. 3

CFL : CFL1, CFL2, CFL3
WCL : WCL1, WCL2
ED : PXE, EML, CME

DISPLAY DEVICE AND METHOD OF FABRICATING THE SAME

This application claims priority to Korean Patent Application No. 10-2022-0130095, filed on Oct. 11, 2022, and No. 10-2023-0053950, filed on Apr. 25, 2023, and all the benefits accruing therefrom under 35 U.S.C. § 119, the contents of which in their entireties are herein incorporated by reference.

BACKGROUND

1. Field

The disclosure relates to a display device and a method of fabricating the display device.

2. Description of the Related Art

Display devices are becoming more important with developments in multimedia technology. Accordingly, various display devices such as a liquid crystal display (LCD) device, an organic light-emitting diode (OLED) display device, and the like are widely used in various fields.

A self-luminous display device, which is a type of display device, includes self-luminous elements such as OLEDs. Each of the self-luminous elements may include two electrodes opposite to each other and an emission layer interposed between the two electrodes. In a case where the self-luminous elements are OLEDs, electrons and holes from the two electrodes may recombine together in the emission layer to generate excitons, and light may be emitted in response to the transition of the excitons from an excited state to a ground state.

The self-luminous display device may not include any separate light source (such as a backlight unit) and can thus be implemented as a low-power consumption, thin, and light-weight display device with high-quality characteristics such as wide viewing angles, high luminance and contrast, and a fast response speed, thereby drawing attention as a next-generation display device.

SUMMARY

Embodiments of the disclosure provide a display device including power lines, which are disposed in a display area, are supplied with voltages, and are electrically connected to a common electrode.

Embodiments of the disclosure also provide a display device capable of preventing damage to power lines when connecting the power lines and the common electrode to each other and a method of fabricating the display device.

However, embodiments of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device includes a data conductive layer including a first power line, which is disposed on a substrate, a passivation layer disposed on the data conductive layer, where a first opening, which exposes at least part of the first power line, is defined through the passivation layer, a protective layer disposed on the passivation layer, a via layer disposed on the protective layer, where a second opening, which partially overlaps the first opening, is defined through the via layer, a pixel electrode disposed on the via layer, a connection electrode spaced apart from the pixel electrode and disposed, at least in part, in the first and second openings, a pixel-defining film disposed on the pixel electrode and the connection electrode, where an opening, which overlaps the second opening, is defined through the pixel-defining film, a light-emitting layer disposed on the pixel-defining film, and at least in part, on the pixel electrode and the connection electrode, and a common electrode disposed on the light-emitting layer and electrically connected to the first power line. In such an embodiment, the data conductive layer includes a data base layer, a data main metal layer, which is disposed on the data base layer, and a data capping layer, which is disposed on the data main metal layer, the first power line includes a wire connection structure, in which the data main metal layer is recessed from sides of the data capping layer, and the common electrode is electrically connected to the data main metal layer in the wire connection structure.

In an embodiment, the protective layer may be recessed in part from sidewalls of the pixel-defining film defining the second opening, below the via layer.

In an embodiment, the protective layer may include silicon oxide, silicon nitride, or silicon oxynitride.

In an embodiment, the connection electrode may be disposed, at least in part, on sides of the data main metal layer.

In an embodiment, the first power line may include first sidewalls, which overlap the first and second openings and on which the wire connection structure is disposed, second sidewalls, which overlap the first opening and does not overlap the second opening, and covered by the passivation layer, and a third sidewall, which does not overlap the first and second openings and covered by the via layer.

In an embodiment, the second sidewalls and the third sidewall of the first power line may be in parallel with sides of the data main metal layer and the sides of the data capping layer.

In an embodiment, the connection electrode may be disposed to cover sides of the data main metal layer.

In an embodiment, a wire opening may be defined through the first power line, and the first and second openings may be disposed to partially overlap the wire opening.

In an embodiment, the wire connection structure may be disposed on first sidewalls of the first power line defining the wire opening and overlapping the first and second openings.

In an embodiment, sidewalls of the wire opening which do not overlap at least one selected from the first and second openings may be covered by the passivation layer or the via layer and be in parallel with sides of the data main metal layer and the sides of the data capping layer.

In an embodiment, the display device may further include a second power line spaced apart from the first power line, where the first and second openings may overlap a side of the first power line, and may not overlap the second power line.

In an embodiment, the wire connection structure may overlap the first and second openings of the first power line.

In an embodiment, the first power line may include first and second sublines, which are spaced apart, at least in part, from each other, and the first and second openings may overlap a side of the first subline, and may not overlap the second subline.

In an embodiment, the wire connection structure may be disposed on a part of the first subline which overlaps the first and second openings.

According to an embodiment of the disclosure, a display device includes a data conductive layer including a first power line, which is disposed on a substrate, a passivation layer disposed on the data conductive layer, where a first opening, which exposes at least part of the first power line, is defined through the passivation layer, a protective layer disposed on the passivation layer, a via layer disposed on the protective layer, a second opening, which partially overlaps the first opening, is defined through the via layer, a pixel electrode disposed on the via layer, a pixel-defining film disposed on the pixel electrode, an opening, which overlaps the second opening, is defined through the pixel-defining, a light-emitting layer disposed on the pixel-defining film, and at least in part, on the pixel electrode and a connection electrode, and a common electrode disposed on the light-emitting layer and electrically connected to the first power line. In such an embodiment, the data conductive layer includes a data base layer, a data main metal layer, which is disposed on the data base layer, and a data capping layer, which is disposed on the data main metal layer, the protective layer is recessed inwardly below the pixel-defining film, the first power line includes a wire connection structure, in which the data main metal layer is recessed from sides of the data capping layer, and the common electrode is electrically connected to the data main metal layer in the wire connection structure.

According to an embodiment of the disclosure, a method of fabricating a display device, includes forming a first power line on a substrate, where the first power line includes a data base layer, a data main metal layer, which is disposed on the data base layer, and a data capping layer, which is disposed on the data main metal layer, forming a passivation layer on the first power line, where a first opening, which partially exposes the first power line, is formed through the passivation layer, forming a protective layer on the passivation layer to cover a part of the first power line exposed by the first opening, forming a via layer on the protective layer, where a second opening, which partially overlaps the first opening and exposes the protective layer, is formed through the via layer, forming a wire connection structure, in which the data main metal layer is recessed from the data capping layer, by etching a part of the protective layer exposed by the second opening and etching the part of the first power line exposed by the first opening, and forming a common electrode on the via layer, and at least in part, in the second opening to be electrically connected to the data main metal layer of the wire connection structure.

In an embodiment, the protective layer may include silicon oxide, silicon nitride, or silicon oxynitride.

In an embodiment, the etching the part of the protective layer may include performing an isotropic etching process using the via layer as a mask, and the protective layer may be formed to be recessed in part below the via layer.

In an embodiment, the method may further include before the forming the common electrode: forming a connection electrode on the via layer, and at least in part, in the second opening; and forming a light-emitting layer on the connection electrode, where at least a part of the connection electrode may be disposed on sides of the data main metal layer, and the common electrode may be disposed on the connection electrode.

In an embodiment, the method may further include before the etching the part of the protective layer: forming a pixel-defining film on the via layer, and at least in part, in the second opening, where the etching the part of the protective layer may including performing an isotropic etching process using the pixel-defining film as a mask.

According to embodiments of the disclosure, a passivation layer capable of preventing a metal layer of a power line from being oxidated by an organic insulating material during the formation of the power line is provided. As the metal layer of the power line is protected by the passivation layer during the formation of the power line, which is electrically connected to a common electrode in a display area, any electrical connection defect between the common electrode and the power line may be effectively prevented.

In such embodiments, as connection structure is formed in the display area, voltage drops in electric potential applied to the common electrode may be effectively prevented.

It should be noted that the effects of the disclosure are not limited to those described above, and other effects of the disclosure will be apparent from the following description.

BRIEF DESCRIPTION OF THE DRAWINGS

The above and other features of the disclosure will become more apparent by describing in detail embodiments thereof with reference to the attached drawings, in which:

FIG. 3 is a cross-sectional view of the display device of FIG. 1;

DETAILED DESCRIPTION

Figure 1:
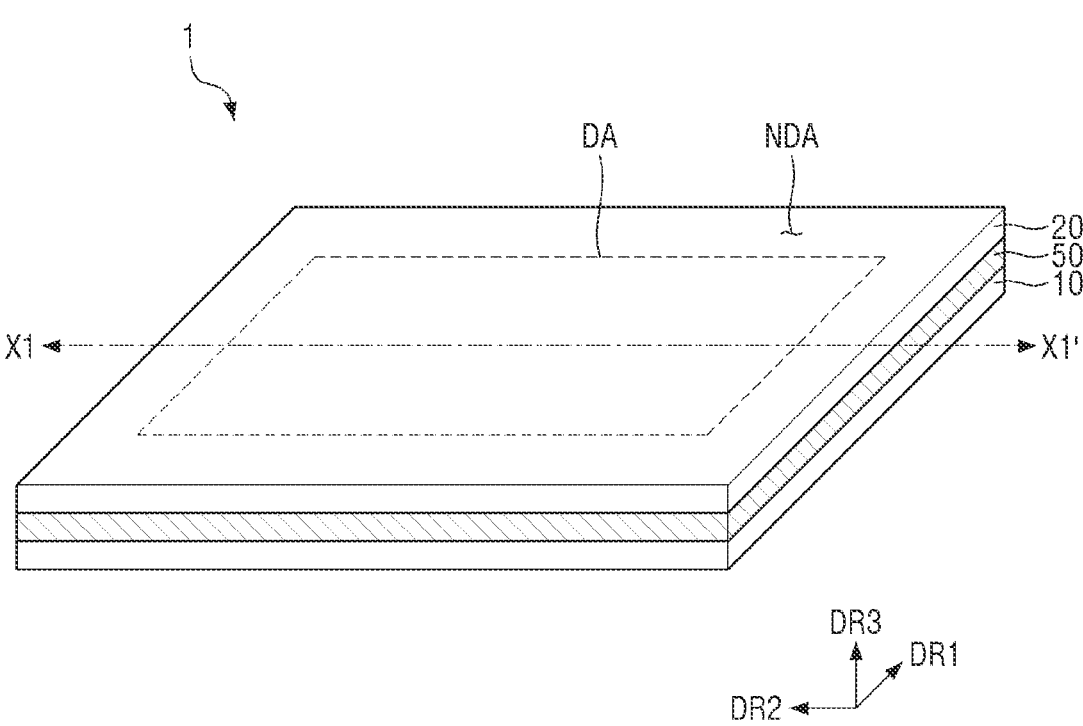
FIG. 1 is a perspective view of a display device according to an embodiment of the disclosure.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the accompanying drawings.

Figure 2:
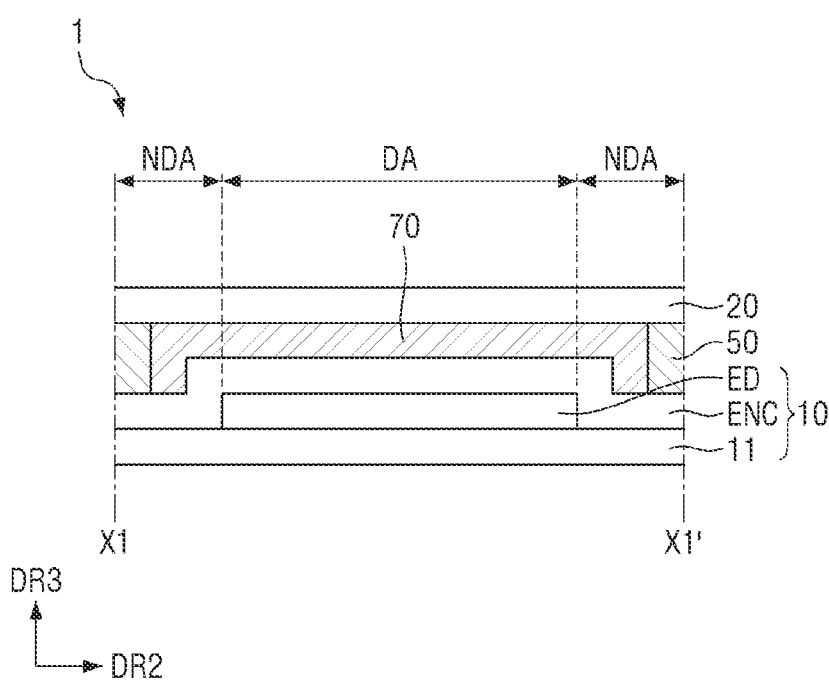
FIG. 2 is a cross-sectional view taken along line X1-X1' of FIG. 1.

FIG. 1 is a perspective view of a display device according to an embodiment of the disclosure. FIG. 2 is a cross-sectional view taken along line X1-X1' of FIG. 1.

Referring to FIGS. 1 and 2, an embodiment of a display device 1 displays a moving image or a still image. The display device 1 may refer to any type of electronic device that provides a display screen. In an embodiment, the display device 1 may include a television (TV), a notebook computer, a monitor, a billboard, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, or a camcorder, for example.

In an embodiment, the display device 1 may be an inorganic light-emitting diode display device, an organic light-emitting diode (OLED) display device, a quantum-dot light-emitting display device, a plasma display device, or a field-emission display (FED) device, for example. The display device 1 will hereinafter be described as being, for example, an OLED display device, but the disclosure is not limited thereto. Alternatively, the display device 1 may be applicable to various other display devices.

The shape of the display device 1 may vary or variously modified. In an embodiment, for example, the display device 1 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DA of the display device 1 may be similar to the shape of the display device 1. FIGS. 1 and 2 illustrate an embodiment where the display device 1 and the display area DA both have a rectangular shape that extends in a first direction DR1 and a second direction DR2. Here, a third direction DR3 perpendicular to the first direction DR1 and the second direction DR2 may be a thickness direction of the display device 1.

The display device 1 may include the display area DA and a non-display area NDA. The display area DA may be an area in which a screen is displayed, and the non-display area NDA may be an area in which a screen is not displayed. The display area DA may also be referred to as an active area, and the non-display area NDA may also be referred to as an inactive area. The display area DA may occupy the middle part of the display device 1.

In an embodiment, as shown in FIGS. 1 and 2, the display device 1 may include a display substrate 10 and a color conversion substrate 20, which is opposite to the display substrate 10, and may further include a sealing part 50, which couples the display substrate 10 and the color conversion substrate 20 to each other, and a filler member 70, which is disposed between the display substrate 10 and the color conversion substrate 20.

The display substrate 10 may include elements and circuits for displaying an image (e.g., pixel circuits such as switching elements), a pixel-defining film, which defines light-emitting areas and a non-light-emitting area in the display area DA, and self-light-emitting elements. The self-light-emitting elements may include organic light-emitting diodes (OLEDs), quantum-dot light-emitting diodes (LEDs), micro-LEDs including an inorganic material, and/or nano-LEDs including an inorganic material. For convenience, the self-light-emitting elements will hereinafter be described as being OLEDs.

The color conversion substrate 20 may be positioned on the display substrate 10 and may face the display substrate 10. In some embodiments, the color conversion substrate 20 may include a color conversion pattern layer capable of converting the color of incident light. In some embodiments, the color conversion substrate 20 may include color filters and/or a wavelength conversion pattern layer. In some embodiments, the color conversion substrate 20 may include both the color filters and the wavelength conversion pattern layer.

The sealing part 50 may be positioned between the display substrate 10 and the color conversion substrate 20, in the non-display area NDA. In a plan view or when viewed in the third direction DR3, the sealing part 50 may be disposed along the edges of each of the display substrate 10 and the color conversion substrate 20, in the non-display area NDA, to surround the display area DA. The display substrate 10 and the color conversion substrate 20 may be coupled together via the sealing part 50.

In some embodiments, the sealing part 50 may include or be formed of an organic material. In an embodiment, for example, the sealing part 50 may be formed of an epoxy resin, but the disclosure is not limited thereto.

In some embodiments, the sealing part 50 may be positioned to overlap a thin-film encapsulation layer ENC of the display substrate 10. In such embodiments, the sealing part 50 may be positioned between the thin-film encapsulation layer ENC and the color conversion substrate 20, in the non-display area NDA. In some embodiments, the sealing part 50 may be in direct contact with the thin-film encapsulation layer ENC.

The filler member 70 may be positioned in the space between the display substrate 10 and the color conversion substrate 20, surrounded by the sealing part 50. The filler member 70 may fill the gap between the display substrate 10 and the color conversion substrate 20.

In some embodiments, the filler member 70 may include or be formed of a material capable of transmitting light therethrough. In some embodiments, the filler member 70 may include or be formed of an organic material. In an embodiment, for example, the filler member 70 may include or be formed of a silicone-based organic material, an epoxy-based organic material, or the mixture thereof.

In some embodiments, the filler member 70 may include or be formed of a material having an extinction coefficient of substantially zero. There is a correlation between refractive index and extinction coefficient, and the less the refractive index, the less the extinction coefficient. When the refractive index is 1.7 or less, the extinction coefficient substantially converges on zero. In some embodiments, the filler member 70 may include or be formed of a material having a refractive index of 1.7 or less, and as a result, the absorption of light provided by the self-light-emitting elements, through the filler member 70, nay be effectively prevented or substantially minimized. In some embodiments, the filler member 70 may include or be formed of an organic material having a refractive index of 1.4 to 1.7.

Figure 3:
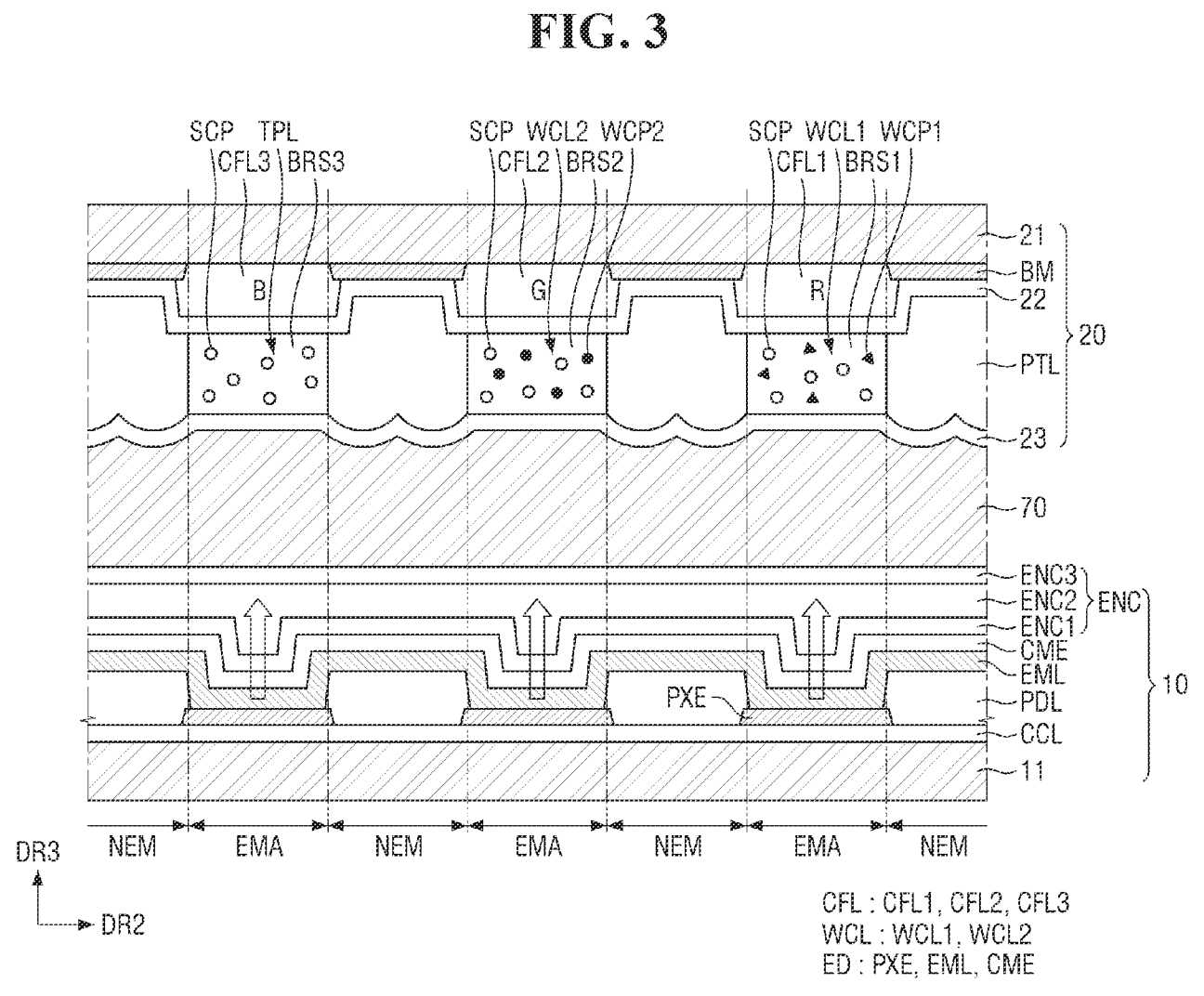

FIG. 3 is a cross-sectional view of the display device of FIG. 1. Specifically, FIG. 3 illustrates the cross-sectional structures of the display substrate 10 and the color conversion substrate 20.

Referring to FIG. 3, the display device 1 is illustrated as being, for example, a top emission display device emitting light in a direction from a first substrate 11 to a second substrate 21, rather than in a direction from the second substrate 21 to the first substrate 11, but the disclosure is not limited thereto.

Referring to FIG. 3, an embodiment of the display device 1 may include a light-emitting layer EML, the thin-film encapsulation layer ENC, which covers the light-emitting layer EML, and a wavelength conversion layer WCL and a light-transmitting layer TPL, which are disposed on the thin-film encapsulation layer ENC. The display device 1 may include the display substrate 10 and the color conversion substrate 20, which is opposite to the display substrate 10. The light-emitting layer EML, the thin-film encapsulation layer ENC, the wavelength conversion layer WCL, and the light-transmitting layer TPL may be included in one of the display substrate 10 and the color conversion substrate 20.

In an embodiment, for example, the display substrate 10 may include the first substrate 11, the light-emitting layer EML, which is disposed on one surface of the first substrate 11, and the thin-film encapsulation layer ENC, which is disposed on the light-emitting layer EML, and the color conversion substrate 20 may include the second substrate 21 and the wavelength conversion layer WCL and the light-transmitting layer TPL, which are disposed on a surface of the second substrate 21 that faces the first substrate 11.

The filler member 70 may be disposed between the thin-film encapsulation layer ENC and the wavelength conversion layer WCL/the light-transmitting layer TPL. The filler member 70 may fill the space between the display substrate 10 and the color conversion substrate 20 and may bond the display substrate 10 and the color conversion substrate 20 together.

The first substrate 11 of the display substrate 10 may be an insulating substrate. The first substrate 11 may include a transparent material. In an embodiment, for example, the first substrate 11 may include a transparent insulating material such as glass or quartz. In an embodiment, the first substrate 11 may be a rigid substrate, but the disclosure is not limited thereto. Alternatively, the first substrate 11 may include a plastic material such as polyimide and may be flexible (e.g., bendable, foldable, or rollable).

A plurality of pixel electrodes PXE may be disposed on the surface of the first substrate 11. The pixel electrodes PXE may be disposed in emission areas EMA. The pixel electrodes PXE may be separate from one another between the emission areas EMA. A circuit layer CCL may be disposed on the first substrate 11. The circuit layer CCL may be disposed between the first substrate 11 and the pixel electrodes PXE. The circuit layer CCL will be described later in detail.

The pixel electrodes PXE may be first electrodes (e.g., anodes) of LEDs. The pixel electrodes PXE may have a structure in which a layer of a material with a high work function such as indium tin oxide (ITO), indium zinc oxide (IZO), zinc oxide (ZnO), or indium oxide ($In_2O_3$) and a layer of a reflective material such as a silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof are stacked. Here, the layer of the material with a high work function may be disposed above the material of the reflective material, close to the light-emitting layer EML. The pixel electrodes PXE may have a multilayer structure of ITO/Mg, ITO/MgF, ITO/Ag, or ITO/Ag/ITO, but the disclosure is not limited thereto.

A pixel-defining film PDL may be disposed on the surface of the first substrate 11. The pixel-defining film PDL may be disposed on the pixel electrodes PXE and may be provided with openings exposing the pixel electrodes PXE, that is, the openings exposing the pixel electrodes PXE are defined through the pixel-defining film PDL. The emission areas EMA and a non-emission area NEM may be defined by the pixel-defining film PDL and the openings of the pixel-defining film PDL. The pixel-defining film PDL may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene (BCB). Alternatively, the pixel-defining film PDL may include an inorganic material.

The light-emitting layer EML may be disposed on the pixel-defining film PDL. The light-emitting layer EML may be disposed on the pixel electrodes PXE, in the openings of the pixel-defining film PDL, to cover the top surface of the pixel-defining film PDL. The light-emitting layer EML, unlike the pixel electrodes PXE, may not be separate between the emission areas EMA and may be formed as a common layer. In an embodiment where the display device 1 is an OLED display device, the light-emitting layer EML may include an organic layer containing an organic material. The organic layer may include an organic light-emitting layer and may further include a hole injection/transport layer and/or an electron injection/transport layer as auxiliary layers for assisting with the emission of light. Alternatively, in an embodiment where the display device 1 is a micro-LED display device or a nano-LED display device, the light-emitting layer EML may include an inorganic material such as an inorganic semiconductor.

In some embodiments, the light-emitting layer EML may have a tandem structure including a plurality of organic light-emitting layers that are stacked in a thickness direction and a charge-generating layer disposed between the organic light-emitting layers. The organic light-emitting layers may emit light of a same wavelength as each other or light of different wavelengths from each other. In an embodiment, at least some of the organic light-emitting layers of different pixels may be separated (or disconnected) from each other.

In an embodiment, for example, the wavelength of light emitted by the light-emitting layer EML may be uniform throughout the pixels. In an embodiment, for example, the light-emitting layer EML may emit blue light or ultraviolet (UV) light, and different colors may be displayed by different emission areas EMA because the color conversion substrate 20 includes the wavelength conversion layer WCL and the light-transmitting layer TPL.

In an alternative embodiment, for example, the wavelength of light emitted by the light-emitting layer EML may differ from one emission area EMA to another emission area EMA. The light-emitting layer EML may emit light of a first color in a first emission area, light of a second color in a second emission area, and light of a third color in a third emission area. In such an embodiment, the light-emitting layer EML of the first, second, and third emission areas may be separated from each other and may be disposed in the openings of the pixel-defining film PDL.

A common electrode CME may be disposed on the light-emitting layer EML. The common electrode CME may be connected or commonly provided throughout the emission areas EMA. The common electrode CME may be a full electrode disposed on the entire surface of the first substrate 11 throughout the emission areas EMA. The common electrode CME may correspond to the second electrodes (e.g., cathodes) of LEDs.

The common electrode CME may include a layer of a material with a low work function such as Li, Ca, lithium fluoride/calcium (LiF/Ca), lithium fluoride/aluminum (LiF/Al), Al, Mg, Ag, Pt, Pd, Ni, Au, Nd, Ir, barium fluoride (BaF), barium (Ba), or a compound or mixture thereof (e.g., the mixture of Ag and Mg). The common electrode CME may further include a layer of a transparent metal oxide on the layer of the material with a low work function.

The pixel electrodes PXE, the light-emitting layer EML, and the common electrode CME may form light-emitting elements (e.g., OLEDs). Light emitted by the light-emitting layer EML may be emitted in an upward direction through the common electrode CME.

The thin-film encapsulation layer ENC may be disposed on the common electrode CME. The thin-film encapsulation layer ENC may include one or more thin-film encapsulation layers. In an embodiment, for example, the thin-film encapsulation layers may include a first inorganic film ENC1, an organic film ENC2, and a second inorganic film ENC3. The first and second inorganic films ENC2 and ENC3 may include silicon nitride ($SiN_x$), silicon oxide ($SiO_x$) or silicon oxynitride ($SiO_xN_y$). The organic film ENC2 may include an organic insulating material such as an acrylic resin, an epoxy resin, a phenolic resin, a polyamide resin, a polyimide resin, an unsaturated polyester resin, a polyphenylene resin, a polyphenylene sulfide resin, or BCB.

The color conversion substrate 20 may be disposed above the thin-film encapsulation layer ENC to face the display substrate 10. The second substrate 21 of the color conversion substrate 20 may include a transparent material. The second substrate 21 may include a transparent insulating material such as glass or quartz. In an embodiment, the second substrate 21 may be a rigid substrate. However, the disclosure is not limited to this. Alternatively, the second substrate 21 may include a plastic material such as polyimide and may be flexible (e.g., bendable, foldable, or rollable).

The second substrate 21 may be the same as the first substrate 11 or may be different from the first substrate 11 in terms of material, thickness, and transmissivity. In an embodiment, for example, the second substrate 21 may have a higher transmissivity than the first substrate 11. The second substrate 21 may be thicker or thinner than the first substrate 11.

A light-blocking member BM may be disposed on the surface of the second substrate 21 that faces the first substrate 11, along the boundaries of each of the emission areas EMA. The light-blocking member BM may overlap the pixel-defining film PDL of the display substrate 10 and may be disposed in the non-emission area NEM. The light-blocking member BM may be provided with openings exposing parts of the surface of the second substrate 21 that overlap the emission areas EMA. The light-blocking member BM may be formed in a lattice shape in a plan view or when viewed in the third direction DR3.

The light-blocking member BM may include an organic material. The light-blocking member BM may absorb external light and may thereby reduce color distortion that may be caused by the reflection of external light. Also, the light-blocking member BM may prevent light emitted by the light-emitting layer EML from infiltrating between different emission areas EMA.

In an embodiment, for example, the light-blocking member BM may absorb all visible wavelengths. The light-blocking member BM may include a light-absorbing material. In an embodiment, for example, the light-blocking member BM may be formed of a material that can be used as the black matrix of the display device 1.

In an alternative embodiment, for example, the light-blocking member BM may absorb light of a particular visible wavelength and may transmit light of another particular visible wavelength therethrough. The light-blocking member BM may include the same material as a color filter layer CFL. In an embodiment, the light-blocking member BM may include a same material as a blue filter layer CFL3. In such an embodiment, the light-blocking member BM may be integrally formed with the blue filter layer CFL3 as a single unitary and indivisible part. In some embodiments, the light-blocking member BM may not be provided.

The color filter layer CFL may be disposed on the surface of the second substrate 21 where the light-blocking member BM is disposed. The color filter layer CFL may be disposed on the parts of the surface of the second substrate 21 that are exposed by the openings of the light-blocking member BM. The color filter layer CFL may be disposed even on the light-blocking members BML.

The color filter layer CFL may include a first color filter layer CFL1, which is disposed in the first emission area, a second color filter layer CFL2, which is disposed in the second emission area, and the third color filter layer CFL3, which is disposed in the third emission area. The color filter layer CFL may include a colorant such as a pigment or dye capable of absorbing all wavelengths except for a particular designated wavelength. The first color filter layer CFL1 may be a red filter layer, the second color filter layer CFL2 may be a green filter layer, and the third color filter layer CFL3 may be a blue filter layer. In an embodiment, the color filter layer CFL may be disposed on the light-blocking members BML to be spaced apart from one another. Alternatively, the color filter layer CFL may overlap, at least partially, one another, on the light-blocking members BML.

A first capping layer 22 may be disposed on the color filter layer CFL. The first capping layer 22 may effectively prevent the color filter layer CFL from being damaged or contaminated by impurities from the outside such as moisture or air. Also, the first capping layer 22 may prevent the colorants of the color filter layer CFL from diffusing into other elements.

The first capping layer 22 may be in direct contact with surfaces (e.g., the bottom surfaces) of the color filter layer CFL. The first capping layer 22 may includer or be formed of an inorganic material. In an embodiment, for example, the first capping layer 22 may include silicon nitride, aluminum nitride, zirconium nitride, titanium nitride, hafnium nitride, tantalum nitride, silicon oxide, aluminum oxide, titanium oxide, tin oxide, or silicon oxynitride.

A partition wall PTL may be disposed on the first capping layer 22. The partition wall PTL may be disposed in the non-emission area NEM. The partition walls PTL may be disposed to overlap the light-blocking member BM. The partition walls PTL may include openings exposing the color filter layer CFL. The partition wall PTL may include a photosensitive organic material, but the disclosure is not limited thereto. The partition wall PTL may further include a light-blocking material.

The wavelength conversion layer WCL and the light-transmitting layer TPL may be disposed in spaces exposed by the openings of the partition wall PTL. The wavelength conversion layer WCL and the light-transmitting layer TPL may be formed by an inkjet printing process using the partition wall PTL as a bank, but the disclosure is not limited thereto.

In an embodiment where the light-emitting layer EML emits light of the third color, the wavelength conversion layer WCL may include first and second wavelength conversion patterns WCL1 and WCL2, which are disposed in the first and second emission areas, respectively. The light-transmitting layer TPL may be disposed in the third emission area.

The first wavelength conversion pattern WCL1 may include a first base resin BRS1 and a first wavelength conversion material WCP1, which is disposed in the first base resin BRS1. The second wavelength conversion pattern WCL2 may include a second base resin BRS2 and a second wavelength conversion material WCP2, which is disposed in the second base resin BRS2. The light-transmitting layer TPL may include a third base resin BRS3 and a scatterer material SCP, which is disposed in the third base resin BRS3.

The first, second, and third base resins BRS1, BRS2, and BRS3 may include a transparent organic material. In an embodiment, for example, the first, second, and third base resins BRS1, BRS2, and BRS3 may include an epoxy resin, an acrylic resin, a cardo resin, or an imide resin. The first, second, and third base resins BRS1, BRS2, and BRS3 may include the same material, but the disclosure is not limited thereto.

The scatterer material SCP may be particles of a metal oxide or an organic material. The metal oxide may be titanium oxide ($TiO_2$), zirconium oxide ($ZrO_2$), aluminum oxide ($Al_2O_3$), $In_2O_3$, ZnO, or tin oxide ($SnO_2$), and the organic material may be an acrylic resin or a urethane resin.

The first wavelength conversion material WCP1 may be a material that converts the third color into the first color, and the second wavelength conversion material WCP2 may be a material that converts the third color into the second color. The first and second wavelength conversion materials WCP1 and WCP2 may be quantum dots, quantum rods, phosphors. The quantum dots may include group IV nanocrystals, group II-VI compound nanocrystals, group III-V compound nanocrystals, group IV-VI nanocrystals, or a combination thereof. The first and second wavelength conversion patterns WCL1 and WCL2 may further include the scatterer material SCP.

The light-transmitting layer TPL, which is disposed in the third emission area, transmits therethrough light of the third color incident from the light-emitting layer EML, while maintaining the wavelength of the incident light. The scatterer material SCP of the light-transmitting layer TPL may control the path of light being output through the light-transmitting layer TPL. The light-transmitting layer TPL may not include a wavelength conversion material.

A second capping layer 23 is disposed on the wavelength conversion layer WCL and the light-transmitting layer TPL. The second capping layer 23 may include or be formed of an inorganic material. The second capping layer 23 may include a material selected from among the aforementioned materials for forming the first capping layer 22. The second capping layer 23 may include or be formed of a same material as the first capping layer 22, but the disclosure is not limited thereto.

The filler member 70 may be disposed between the display substrate 10 and the color conversion substrate 20. The filler member 70 may fill the space between the display substrate 10 and the color conversion substrate 20 and may couple the display substrate 10 and the color conversion substrate 20 together. The filler member 70 may be disposed between the thin-film encapsulation layer ENC and the second capping layer 23 of the color conversion substrate 20. The filler member 70 may include or be formed of a silicon (Si)-based organic material or an epoxy-based organic material, but the disclosure is not limited thereto.

Figure 4:
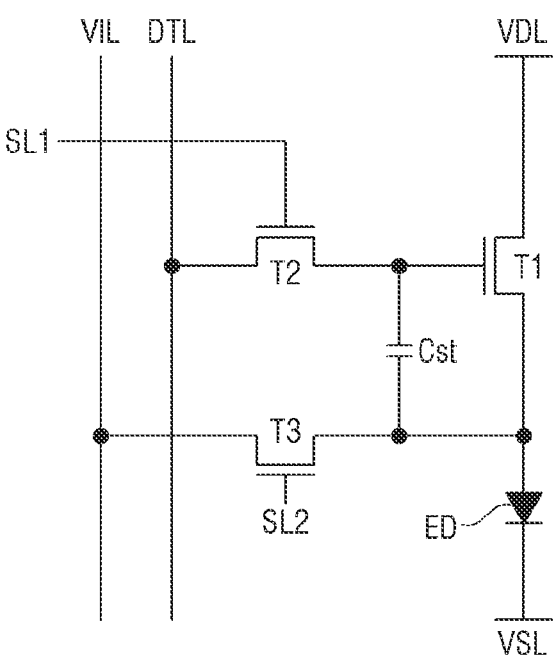
FIG. 4 is a circuit diagram of a pixel of the display device of FIG. 1.

FIG. 4 is a circuit diagram of a pixel of the display device of FIG. 1.

Referring to FIG. 4, an embodiment of the display device 1 may include a plurality of pixels, each including a light-emitting element ED, three transistors, i.e., first, second, and third transistors T1, T2, and T3, and one storage capacitor Cst.

The light-emitting element ED emits light with luminance corresponding to a current applied thereto via the first transistor T1. The light-emitting element ED includes a first electrode, a second electrode, and at least one light-emitting element disposed between the first and second electrodes. The light-emitting element may emit light of a particular wavelength range in accordance with electric signals transmitted thereto from the first and second electrodes.

A first end of the light-emitting element ED may be connected to the source electrode of the first transistor T1, and a second end of the light-emitting element ED may be connected to a second voltage line VSL, which is supplied with a low-potential voltage (hereinafter, a second power supply voltage) that is lower than a high-potential voltage (hereinafter, a first power supply voltage) supplied to the first voltage line VDL.

The first transistor T1 controls a current flowing from the first voltage line VDL, to which the first power supply voltage is supplied, to the light-emitting element ED in accordance with the difference in voltage between the gate electrode and the source electrode of the first transistor T1. In an embodiment, for example, the first transistor T1 may be a transistor for driving the light-emitting element ED. The gate electrode of the first transistor T1 may be connected to the source electrode of the second transistor T2, the source electrode of the first transistor T1 may be connected to the first electrode of the light-emitting element ED, and the drain electrode of the first transistor T1 may be connected to the first voltage line VDL, to which the first power supply voltage is supplied.

The second transistor T2 is turned on by a first scan signal from a first scan line SL1 to connect a data line DTL to the gate electrode of the first transistor T1. The gate electrode of the second transistor T2 may be connected to the first scan line SL1, the source electrode of the second transistor T2 may be connected to the gate electrode of the first transistor T1, and the drain electrode of the second transistor T2 may be connected to the data line DTL.

The third transistor T3 is turned on by a second scan signal from a second scan line SL2 to connect an initialization voltage line VIL to a first end of the light-emitting element ED. The gate electrode of the third transistor T3 may be connected to the second scan line SL2, the drain electrode of the third transistor T3 may be connected to the initialization voltage line VIL, and the source electrode of the third transistor T3 may be connected to the first end of the light-emitting element ED or the source electrode of the first transistor T1.

The source electrodes and the drain electrodes of the first through third transistors T1 through T3 are not limited to the above descriptions. The first through third transistors T1 through T3 may be formed as thin-film transistors (TFTs). FIG. 4 illustrates that the first through third transistors T1 through T3 are formed as N-type metal-oxide semiconductor field-effect transistors (MOSFETs), but the disclosure is not limited thereto. That is, alternatively, the first through third transistors T1 through T3 may all be formed as P-type MOSFETs. Yet alternatively, some of the first through third transistors T1 through T3 may be formed as N-type MOS-FETS, and the other transistor(s) may be formed as P-type MOSFETs.

The storage capacitor Cst is connected between the gate electrode and the source electrode of the first transistor T1. The storage capacitor Cst stores a differential voltage corresponding to the difference in voltage between the gate electrode and the source electrode of the first transistor T1.

Referring to FIG. 4, the gate electrode of the second transistor T2 may be connected to the first scan line SL1, and the gate electrode of the third transistor T3 may be connected to the second scan line SL2. The first and second scan lines SL1 and SL2 may be different scan lines, and the second and third transistors T2 and t3 may be turned on by scan signals from different scan lines. However, the disclosure is not limited to this.

Alternatively, in some embodiments, the gate electrodes of the second and third transistors T2 and T3 may be connected to the same scan line SL. The second and third transistors T2 and T3 may be simultaneously turned on by a scan signal from a same scan line.

Figure 5:
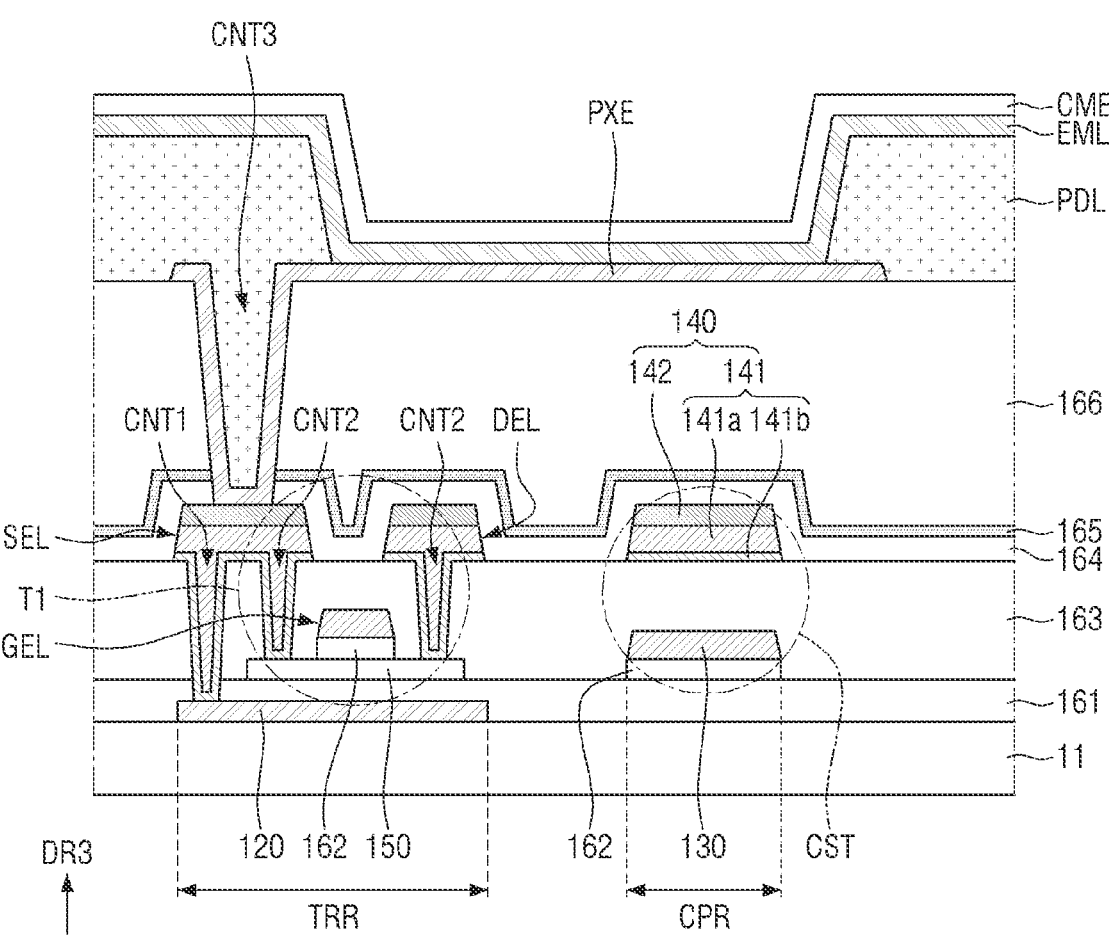
FIG. 5 is a cross-sectional view illustrating part of a display substrate of the display device of FIG. 1.

FIG. 5 is a cross-sectional view illustrating part of a display substrate of the display device of FIG. 1. Specifically, FIG. 5 illustrates the cross-sectional structures of a light-emitting element ED and the circuit layer CCL in an emission area EMA of the display substrate 10 shown in FIG. 3.

Referring to FIG. 5, in an embodiment of the display device, the circuit layer CCL may include a semiconductor layer 150, a plurality of conductive layers, and a plurality of insulating layers, which are disposed on the first substrate 11. The semiconductor layer 150 may include an oxide semiconductor. The conductive layers may include a lower metal layer 120, a gate conductive layer 130, a data conductive layer 140, and a pixel electrode PXE. The insulating layers may include a buffer layer 161, a gate insulating layer 162, an interlayer insulating layer 163, a passivation layer 164, a protective layer 165, and a via layer 166.

The lower metal layer 120 may be disposed on the first substrate 11. The lower metal layer 120 may be a light-blocking layer for protecting the semiconductor layer 150 from external light. The lower metal layer 120 may be patterned or have a patterned shape. The lower metal layer 120 may be disposed in a transistor region TRR. The lower metal layer 120 may be disposed to cover at least the channel region of the semiconductor layer 150 or the entire semiconductor layer 150, from below the semiconductor layer 150. The lower metal layer 120 may be electrically connected to a source electrode SEL of a driving transistor DTR through a first contact hole CNT1 to suppress voltage changes in the driving transistor DTR. The lower metal layer 120 may be formed as (or defined by) a double film where a titanium (Ti) layer and a copper (Cu) layer are stacked, but the disclosure is not limited thereto.

The buffer layer 161 may be disposed on the lower metal layer 120. The buffer layer 161 may be disposed to cover the entire surface of the first substrate 11 where the lower metal layer 120 is formed. The buffer layer 161 may include silicon nitride, silicon oxide, or silicon oxynitride. The buffer layer 161 may include a $SiN_x/SiO_x$ double film.

The semiconductor layer 150 may be disposed on the buffer layer 161. The semiconductor layer 150 may be disposed in the transistor region TRR and may form the channel region of the driving transistor DTR. The semiconductor layer 150 may include an oxide semiconductor. The oxide semiconductor may include, for example, a binary compound $(AB_x)$, a tertiary compound $(AB_xC_y)$, a quaternary compound $(AB_xC_yD_z)$ including indium (In), zinc (Zn), gallium (Ga), tin (Sn), Ti, Al, hafnium (Hf), zirconium (Zr), or Mg. In an embodiment, for example, the semiconductor layer 150 may include indium gallium zinc oxide (IGZO).

The gate insulating layer 162 may be disposed on the semiconductor layer 150. The gate insulating layer 162 may be formed in a same pattern as the gate conductive layer 130 that will be described later. The sides of the gate insulating layer 162 may be aligned with the sides of the gate conductive layer 130, but the disclosure is not limited thereto. The gate insulating layer 162 may include a silicon compound or a metal oxide. In an embodiment, for example, the gate insulating layer 162 may include silicon oxide, silicon nitride, silicon oxynitride, aluminum oxide, tantalum oxide, hafnium oxide, zirconium oxide, or titanium oxide. In an embodiment, for example, the gate insulating layer 162 may include a $SiO_x$ film.

The gate conductive layer 130 may be disposed on the gate insulating layer 162. A gate electrode SEL of the transistor region TRR may be formed of (or defined by a portion of) the gate conductive layer 130. The gate conductive layer 130 is illustrated as having a single-layer structure, but the disclosure is not limited thereto. The gate conductive layer 130, like the data conductive layer 140 that will be described later, may be formed of or defined by one or more layers. The gate conductive layer 130 may include Ti, tantalum (Ta), Ca, Cr, Mg, Ni, Cu, molybdenum (Mo), Al, Ag, IZO, ITO, or indium zinc tin oxide (IZTO).

The interlayer insulating layer 163 may be disposed on the gate conductive layer 130. The interlayer insulating layer 163 may include an inorganic insulating material such as silicon oxide, silicon nitride, silicon oxynitride, hafnium oxide, aluminum oxide, titanium oxide, tantalum oxide, or zinc oxide. In an embodiment, for example, the interlayer insulating layer 163 may include $SiO_xN_y$.

The data conductive layer 140 may be disposed on the interlayer insulating layer 163. The source electrode SEL and a drain electrode DEL of the transistor region TRR may be formed of the data conductive layer 140. The source electrode SEL and the drain electrode DEL may be connected to the semiconductor layer 150 through second contact holes CNT2. The source electrode SEL may be connected to the buffer layer 161 through the first contact hole CNT1, which is defined through the interlayer insulating layer 163 and the buffer layer 161.

The data conductive layer 140 may include a data conductive metal layer 141 and a data capping layer 142, which is disposed on the data conductive metal layer 141. The data conductive metal layer 141 may be formed as a single film, or may be formed as a multifilm. In an embodiment, for example, the data conductive metal layer 141 may include a data main metal layer 141a and a data base layer 141b, which is disposed below the data main metal layer 141a. The data base layer 141b, the data main metal layer 141a, and the data capping layer 142 may all include or be formed of a conductive material. No insulating layers may be interposed between the layers of the data conductive layer 140 that overlap one another in a thickness direction. The data base layer 141b, the data main metal layer 141a, and the data capping layer 142 may be patterned by a single or same mask process. The sides of each of the layers of the data conductive layer 140 may be aligned with one another. In some embodiments, in the data conductive layer 140, the sides of each lower layer may not be projected outwardly from the sides of their respective upper layers. That is, the data conductive layer 140 may not include tips that are formed by each upper layer of the data conductive layer 140 being projected beyond their respective lower layers. In this case, in the data conductive layer 140, the sides of each lower layer may be aligned with, or projected outwardly from, the sides of their respective upper layers.

In an embodiment, the data capping layer 142 of the data conductive layer 140 that the common electrode CME is in contact with in the non-emission area NEM may include tips projected from the sides of the data main metal layer 141a. The common electrode CME, which is disposed in the entire display area DA, may be in contact with the data conductive layer 140, in the non-emission area NEM of the display area DA and with the data main metal layer 141a, below tips of the data conductive layer 140, and this will be described later.

The data base layer 141b may improve the properties of the data main metal layer 141a such as adhesiveness main or may effectively prevent a reactive material from the interlayer insulating layer 163 from penetrating into the data main metal layer 141a. The data base layer 141b may include a transparent electrode including a metal material such as Ti, Ta, Ca, Cr, Mg, Ni, or an alloy thereof, In, Zn, Sn, Ga, and Al. In an embodiment, for example, the data base layer 141b may include Ti, but the disclosure is not limited thereto.

The data main metal layer 141a may transmit signals mainly and may be formed of a low-resistance material. The data main metal layer 141a may be thicker than the data base layer 141b and the data capping layer 142 and may include or be formed of a material having a lower resistance than the data base layer 141b and the data capping layer 142. The data main metal layer 141a may include a material such as Cu, Al, Ag, or Mo, but the disclosure is not limited thereto. In an embodiment, for example, the data main metal layer 141a may include Cu.

The data capping layer 142 protects the data main metal layer 141a by covering the data main metal layer 141a, from above the data main metal layer 141a. The data capping layer 142 may protect the data main metal layer 141a from etchants or chemicals for use in forming the layers or elements (e.g., a third contact hole CNT3) on the data conductive layer 140. Also, the data capping layer 142 may effectively prevent the via layer 166 from being in direct contact with the data main metal layer 141a and corroded by the material of the via layer 166. Also, the data capping layer 142 may effectively prevent the material (e.g., Cu) of the data main metal layer 141a from diffusing into neighboring upper films. The data capping layer 142 may be in direct contact with the data main metal layer 141a.

The data capping layer 142 may include a transparent material such as ITO, IZO, IZTO, indium gallium tin oxide (IGTO), gallium zinc oxide (GZO), or gallium zinc tin oxide (GZTO). The data capping layer 142 may also include an alloy of Ti or Mo. In an embodiment, for example, the data capping layer 142 may be formed as a multilayer film of Ti/Mo/ITO. In an embodiment, for example, the data conductive layer 140 may include a triple film of Ti/Cu/ITO or a stack of Ti/Cu/Ti/Mo/ITO.

The passivation layer 164 may be disposed on the data conductive layer 140. The passivation layer 164 may cover and protect the data conductive layer 140. The passivation layer 164 may include an inorganic insulating material such as silicon oxide, silicon nitride, silicon oxynitride, hafnium oxide, aluminum oxide, titanium oxide, tantalum oxide, or zinc oxide.

The protective layer 165 may be disposed on the passivation layer 164. The protective layer 165 may protect the data conductive layer 140 together with the passivation layer 164.

The protective layer 165 may effectively prevent oxides from being formed by the data conductive layer 140 being in contact with the via layer 166 during the formation of a wiring connection structure that will be described later. When the wiring connection structure, which the common electrode CME and the data conductive layer 140 are in contact with, is formed, the protective layer 165 may be disposed to cover the data conductive layer 140 and may prevent the organic material of the via layer 166 from being in direct contact with the data conductive layer 140. The protective layer 165 may include silicon oxide, silicon nitride, or silicon oxynitride. In an embodiment, the protective layer 165 may be formed as a single film, but the disclosure is not limited thereto. Alternatively, the protective layer 165 may be formed as a double film or a multifilm.

The via layer 166 may be disposed on the protective layer 165. The via layer 166 may include an organic insulating material and may planarize the top of the protective layer 165. The via layer 166 may include an organic insulating material such as an acrylic resin, an epoxy resin, a phenolic resin, a polyamide resin, a polyimide resin, an unsaturated polyester resin, a polyphenylene resin, a polyphenylene sulfide resin, or BCB. The via layer 166 may further include a photosensitive material, but the disclosure is not limited thereto. In an embodiment, for example, the via layer 166 may include polyimide.

The pixel electrode PXE may be disposed on the via layer 166. The material of the pixel electrode PXE is the same as those described above with reference to FIG. 3. In an embodiment, for example, the pixel electrode PXE may include a triple film of ITO/Ag/ITO.

The pixel electrode PXE may be disposed in the display area DA, but not in the non-display area NDA. The pixel electrode PXE may overlap the transistor region TRR and a capacitor region CPR of the display area DA, but the disclosure is not limited thereto. The pixel electrode PXE may be connected to the source electrode SEL of the driving transistor DTR through the third contact hole CNT3, which is defined through the via layer 166, the protective layer 165, and the passivation layer 164.

The pixel-defining film PDL may be disposed on the pixel electrode PXE. The material of the pixel-defining film PDL is the same as those described above with reference to FIG. 3. In an embodiment, for example, the pixel-defining film PDL may include polyimide.

The pixel-defining film PDL may be disposed in the display area DA, but not in the non-display area NDA. The pixel-defining film PDL may be disposed to overlap the edges of the pixel electrode PXE. The pixel-defining film PDL may be disposed to overlap the third contact hole CNT3. The pixel-defining film PDL may completely fill the third contact hole CNT3. The pixel-defining film PDL may be disposed on a part of the via layer 166 where the pixel electrode PXE is not formed.

The light-emitting layer EML and the common electrode CME may be disposed on the pixel electrode PXE and the pixel-defining film PDL. The light-emitting layer EML and the common electrode CME may be disposed in the entire display area DA. The light-emitting layer EML and the common electrode CME may be disposed on the pixel electrode PXE and the pixel-defining film PDL, in the emission area EMA, and on the wire connection structure, in the non-emission area NEM.

The common electrode CME may be electrically connected to an external power line (not illustrated), in the non-display area NDA, and a low-potential signal may be applied to the common electrode CME. In an embodiment, the common electrode CME may be electrically connected to a power line, to which the low-potential signal is applied, in the display area DA, to prevent voltage drops in the signal applied to the common electrode CME over the entire display area DA. The common electrode CME may be connected to a power line of the circuit layer CCL, in the non-emission area NEM of the display area DA. In the non-emission area NEM, which is an area where the light-emitting element ED is not disposed, the common electrode CME, which is disposed on the pixel-defining film PDL, may be electrically connected to a power line below the via layer 166 through an opening exposing part of the power line.

Figure 6:
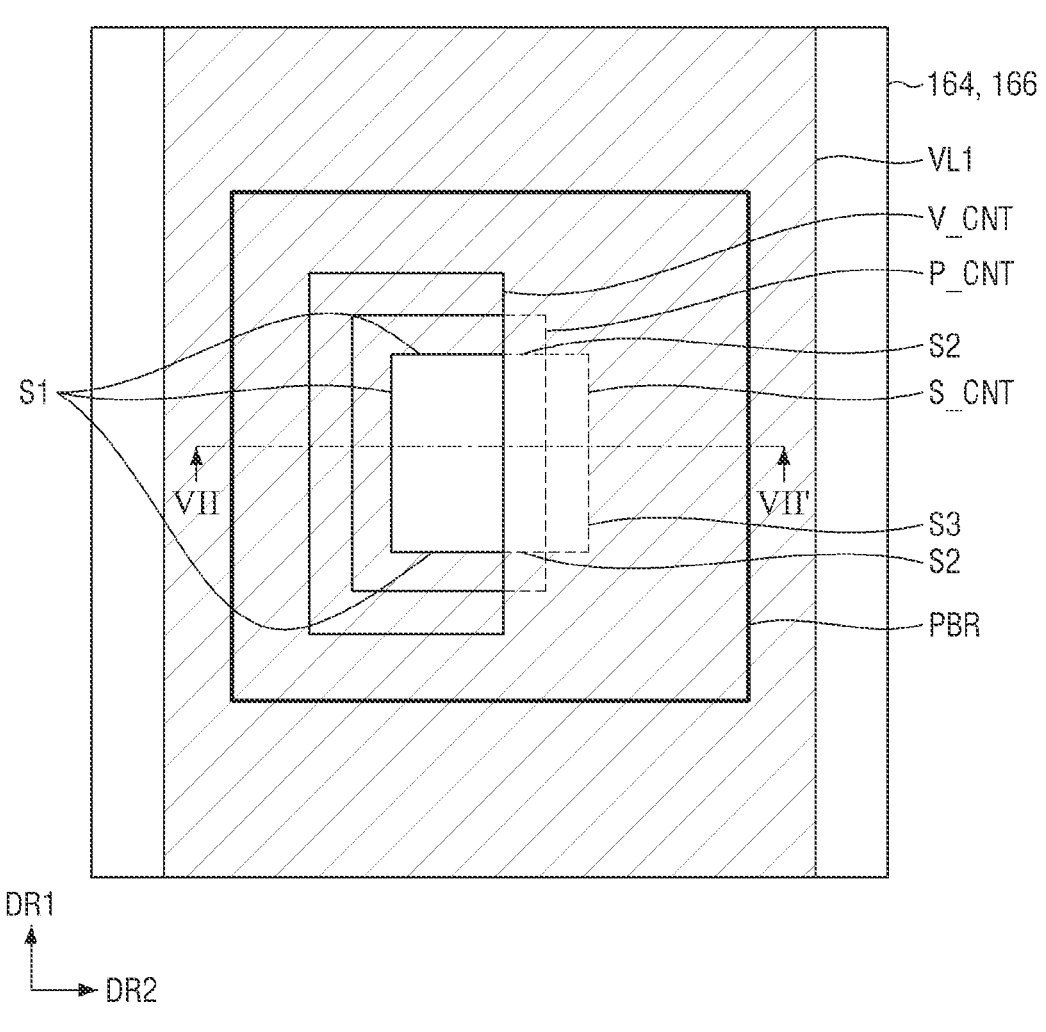
FIG. 6 is a plan view illustrating part of a power line of the display device of FIG. 1.
Figure 7:
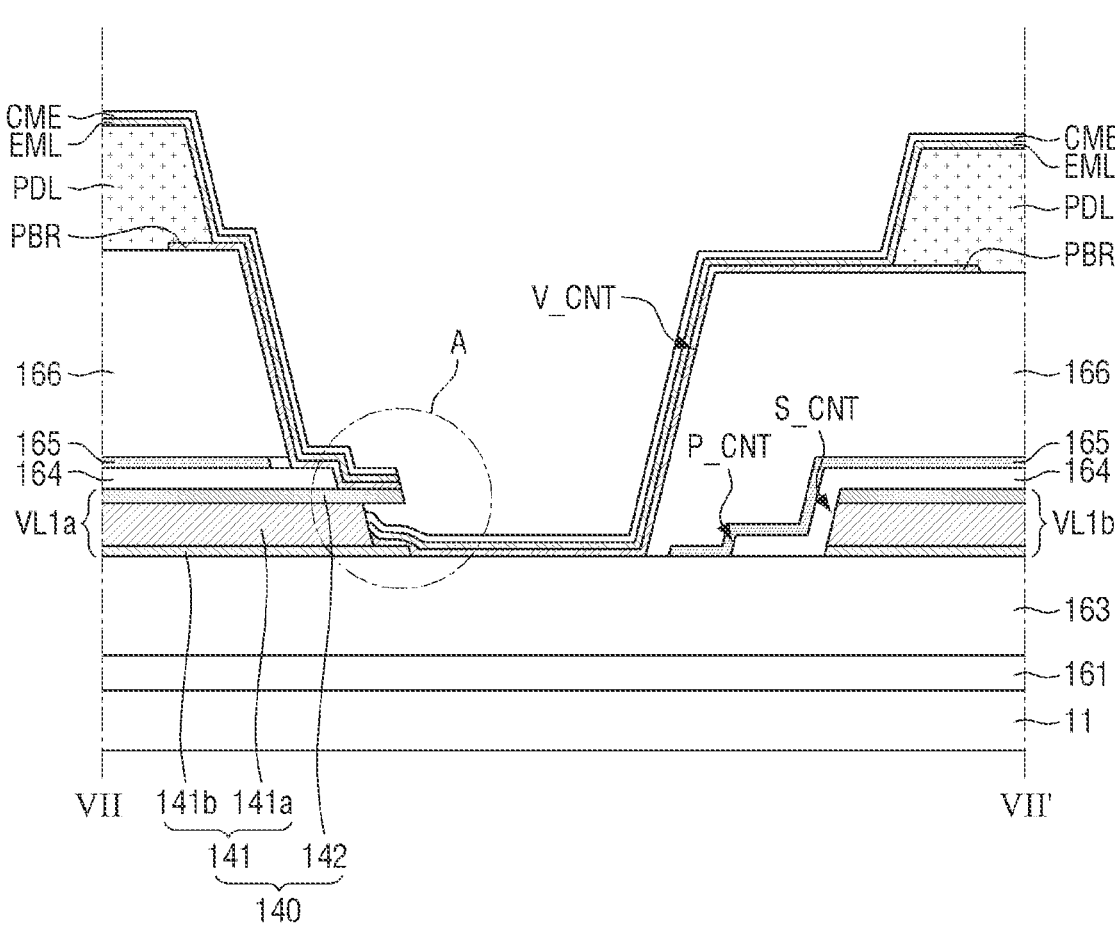
FIG. 7 is a cross-sectional view taken along line VII-VII' of FIG. 6.

FIG. 6 is a plan view illustrating part of a power line of the display device of FIG. 1. FIG. 7 is a cross-sectional view taken along line VII-VII′ of FIG. 6. Specifically, FIG. 6 is a plan view illustrating how the common electrode CME and a first power line VL1 overlap each other in the non-emission area NEM of the display substrate 10.

Referring to FIGS. 6 and 7, the display device 1 may include, in the display area DA, a wire connection structure to which the common electrode CME in the display area DA is electrically connected. The first power line VL1 of the data conductive layer 140 may include the wire connection structure and may thus be electrically connected to the common electrode CME. The common electrode CME may be connected to the external power line, in the non-display area NDA. The common electrode CME may be connected to the first power line VL1, in the display area DA, and may thus receive a low-potential signal.

The first power line VL1 may be disposed in the non-emission area NEM of the display area DA. The first power line VL1 may be disposed around an area where a plurality of pixel electrodes PXE are disposed. The first power line VL1 may be disposed to extend to the non-display area NDA. The first power line VL1 may be connected to the external power line and may thus receive a low-potential voltage. FIGS. 6 and 7 illustrate a part of the first power line VL1 extending in the first direction DR1, but the first power line VL1 may be disposed to surround the area where the pixel electrodes PXE are disposed.

The first power line VL1 may be provided with a wire opening S_CNT defined therethrough. The wire opening S_CNT may be formed through the first power line VL1, and the wire connection structure may be formed on one side of the wire opening S_CNT. The passivation layer 164 and the via layer 166 may be disposed on the first power line VL1, and one side of the wire opening S_CNT may be exposed by a first contact hole P_CNT of the passivation layer 164 and a second contact hole V_CNT of the via layer 166. The wire connection structure may be formed on the exposed side of the wire opening S_CNT, and this will be described later.

The passivation layer 164 may be disposed on the data conductive layer 140 to cover the first power line VL1. The passivation layer 164 may be provided with the first opening P_CNT defined therethrough. The first opening P_CNT may have a greater length than the wire opening S_CNT in the first direction DR1. The first opening P_CNT may be formed to partially overlap the wire opening S_CNT of the first power line VL1, and may not completely expose the wire opening S_CNT of the first power line VL1. In an embodiment, for example, the first opening P_CNT may be formed to overlap, and expose, one side defining the wire opening S_CNT, but may not overlap the other side defining the wire opening S_CNT. The first opening P_CNT may be formed not to completely overlap the wire opening S_CNT. The first power line VL1 may be covered by the passivation layer 164, but a part of the first power line VL1 near the wire opening S_CNT may be exposed by the first opening P_CNT. The wire connection structure may be formed on the part of the first power line VL1, exposed by the first opening P_CNT.

The protective layer 165 may be disposed on the passivation layer 164. The second opening V_CNT of the via layer 166 may be defined to extend further through the protective layer 165. A part of the protective layer 165, exposed by the second opening V_CNT of the via layer 166, may be etched in a way such that part of the protective layer 165 may be inwardly recessed into the via layer 166.

The via layer 166 may be disposed on the protective layer 165 and the passivation layer 164. The via layer 166 may be provided with the second opening V_CNT defined therethrough. The second opening V_CNT may have a greater length than the first opening P_CNT in the first direction DR1. The second opening V_CNT may be formed to partially overlap the first opening P_CNT of the passivation layer 164, and may not completely expose the first opening P_CNT. In an embodiment, for example, the second opening V_CNT may be formed to overlap, and expose, one side of the first opening P_CNT, but may not overlap the other side of the first opening P_CNT. The second opening V_CNT may be formed not to completely overlap the first opening P_CNT. The passivation layer 164 and the first power line VL1 may be covered by the via layer 166, but part of the first power line VL1 near the first opening P_CNT may be exposed by the second opening V_CNT. The wire connection structure may be formed on the part of the first power line VL1, exposed by the second opening V_CNT.

The first power line VL1 may include first sidewalls S1, which are inner sidewalls (or parts of inner sidewalls) defining the wire opening S_CNT that overlap the first and second openings P_CNT and V_CNT, second sidewalls S2, which are inner sidewalls (or parts of inner sidewalls) defining the wire opening S_CNT that overlap the first opening P_CNT, but do not overlap the second opening V_CNT, and a third sidewall S3, which is an inner sidewall defining the wire opening S_CNT that overlaps none of the first and second openings P_CNT and V_CNT. The first sidewalls S1 may be sidewalls (or parts of sidewalls) of a first wire part VL1a, exposed by the first and second openings P_CNT and V_CNT. The second sidewalls S2 and the third sidewall S3 may be sidewalls (or parts of sidewalls) of a second wire part VL1b that are covered by the passivation layer 164, the protective layer 165, or the via layer 166.

The first power line VL1 may include the first wire part VL1a, which is part of the first power line VL1, exposed by the first and second opening P_CNT and V_CNT, and the second wire part VL1b, which is part of the first power line VL1, covered by the passivation layer 164, the protective layer 165, or the via layer 166. The first and second wire parts VL1a and VL1b may be parts of the first power line VL1. The first power line VL1 may include the first wire part VL1a, which is a part of the first power line VL1, exposed by the first and second P_CNT and V_CNT, and the second wire part VL1b, which is the remaining part of the first power line VL1.

A connection electrode PBR may be disposed on the via layer 166. The connection electrode PBR may be disposed in a same layer as the pixel electrodes PXE and may include a same material as the pixel electrodes PXE. The connection electrode PBR may be disposed to overlap the first and second openings P_CNT and V_CNT and the wire opening S_CNT. The connection electrode PBR may be disposed in part in the via layer 166 and may be disposed in part in the first and second openings P_CNT and V_CNT and the wire opening S_CNT to be placed on sides of the first power line VL1, the passivation layer 164, and the via layer 166. The connection electrode PBR may be in contact with the wire connection structure of the data conductive layer 140 or the first power line VL1. The connection electrode PBR, like the protective layer 165, may effectively prevent oxidation of the data main metal layer 141a of the data conductive layer 140.

The pixel-defining film PDL, the light-emitting layer EML, and the common electrode CME may be disposed on the connection electrode PBR. The pixel-defining film PDL may be formed to expose not only the pixel electrodes PXE, but also the second opening V_CNT. Alternatively, the pixel-defining film PDL may be provided with an opening exposing the second opening V_CNT. In such an embodiment where the light-emitting layer EML and the common electrode CME are disposed in the entire display area DA, the light-emitting layer EML and the common electrode CME may be disposed on the connection electrode PBR, which is exposed due to the absence of the pixel-defining film PDL thereon.

Figure 8:
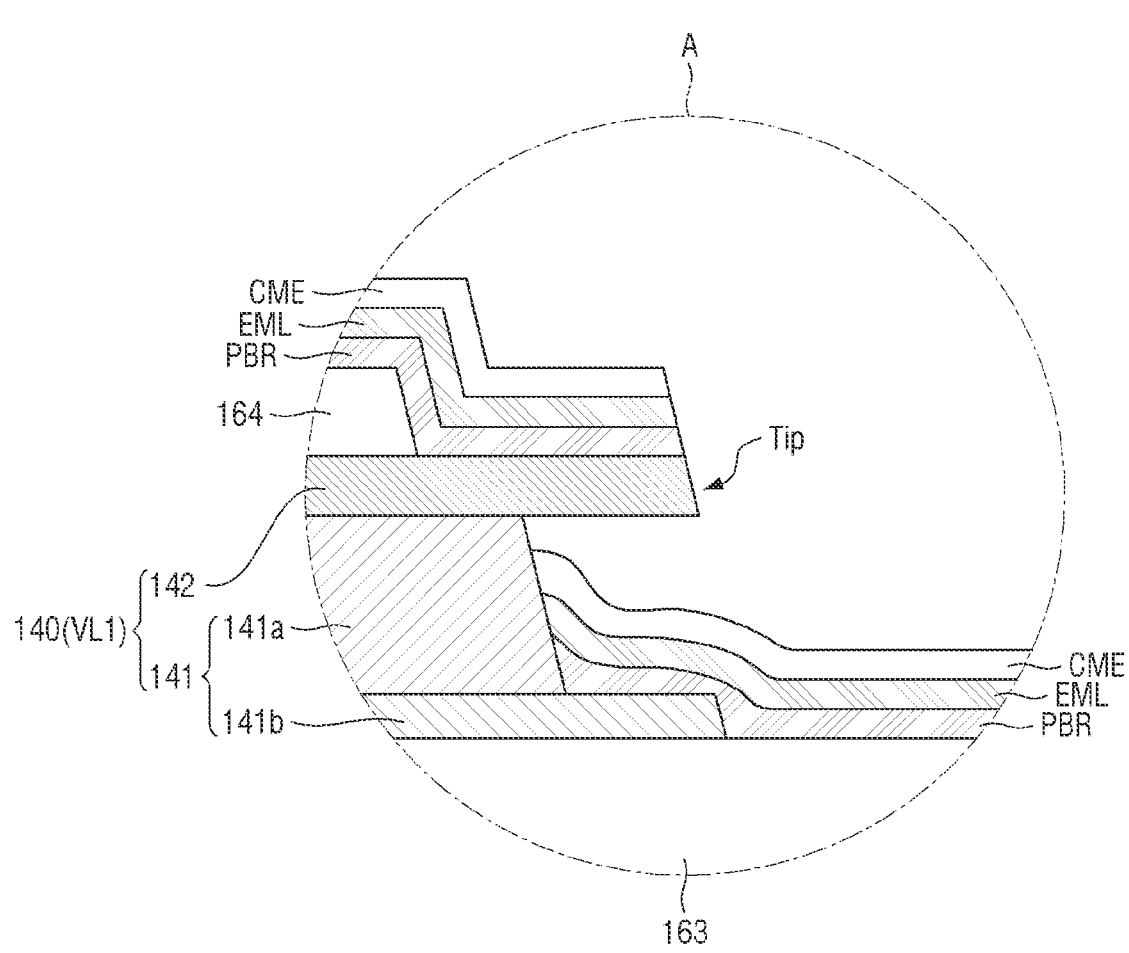
FIG. 8 is an enlarged cross-sectional view illustrating part A of FIG. 7.

FIG. 8 is an enlarged cross-sectional view illustrating part A of FIG. 7.

Referring to FIG. 8 and further to FIGS. 6 and 7, an embodiment of the display device 1 may include the wire connection structure, which is formed in the data conductive layer 140 or the first power line VL1 and in which the data main metal layer 141a is recessed inwardly from the data capping layer 142. The wire connection structure may include a tip, which is formed by the data capping layer 142 protruding from the sides of the data main metal layer 141a. Due to the tip of the data capping layer 142, the connection electrode PBR, the light-emitting layer EML, and the common electrode CME may be disconnected in part in the first and second openings P_CNT and V_CNT. The connection electrode PBR, the light-emitting layer EML, and the common electrode CME may be disposed in part on the tip of the data capping layer 142 and may be disconnected below the tip of the data capping layer 142. The connection electrode PBR, the light-emitting layer EML, and the common electrode CME may be in contact with the side of the data main metal layer 141a, exposed below the tip of the data capping layer 142. The common electrode CME may be in contact with the data main metal layer 141a of the first wire part of the first power line VL1 and may thus be electrically connected to the data main metal layer 141a of the first wire part of the first power line VL1. The common electrode CME1 may receive the low-potential voltage via the first power line VL1. The common electrode CME1 may receive the low-potential voltage in the display area DA and may thus effectively prevent voltage drops.

The wire connection structure, which includes the tip of the data capping layer 142, may be formed only in the first wire part VL1a of the first power line VL1. The wire connection structure may be formed on the first sidewalls S1 defining the wire opening S_CNT, exposed by the first and second openings P_CNT and V_CNT first power line VL1, but does not formed on the second sidewalls S2 and the third sidewall S3 defining the wire opening S_CNT. That is, a tip may be formed only in the first wire part VL1a of the first power line VL1, which includes the first sidewalls S1 defining the wire opening S_CNT, and the second wire part VL1b of the first power line VL1, which includes the second sidewalls S2 and the third sidewall S3 defining the wire opening S_CNT, may be covered by the passivation layer 164 or the via layer 166 and may thus have smooth sides. The sides of the data main metal layer 141a may be exposed in the first wire part VL1a, but not in the second wire part VL1b. The common electrode CME may be disconnected in part by the tip formed on the first sidewalls S1 of the first power line VL1 and may thus be in contact with the data main metal layer 141a. If the tip is formed on all the sidewalls of the wire opening S_CNT, part of the common electrode CME that is in contact with the data main metal layer 141a may be disposed independently in the wire opening S_CNT and may not be electrically connected to parts of the common electrode CME that are included in light-emitting elements ED. Accordingly, in an embodiment, the locations and the sizes of the first and second openings P_CNT and V_CNT may be designed such that the tip may be formed only on the first sidewalls S1 of the wire opening S_CNT.

In an embodiment, as the display device 1 includes the protective layer, which is disposed on the data conductive layer 140, the data main metal layer 141a of the data conductive layer 140 may be effectively prevented from being in contact with the via layer 166 or the pixel-defining film PDL during the formation of the wire connection structure. As the first sidewalls S1 defining the wire opening S_CNT are exposed by the first and second openings P_CNT and V_CNT of the passivation layer 164 and the via layer 166 and the data main metal layer 141a is further etched than the data capping layer 142, the wire connection structure may be formed in the first power line VL1. If the data main metal layer 141a with sides exposed is in contact with the via layer 166 or the pixel-defining film PDL, oxides may be formed on the exposed sides of the data main metal layer 141a. In an embodiment, for example, where the data main metal layer 141a includes Cu, copper oxide ($CuO_x$) may be generated by moisture when the Cu is in contact with an organic insulating material, and as a result, the electrical connection between the common electrode CME and the data main metal layer 141a may be degraded.

In an embodiment, the display device 1 may include the protective layer 165, which covers the exposed sides of the data conductive layer 140 or the first power line VL1, to prevent oxides from being formed on the exposed sides of the data main metal layer 141a. When the via layer 166, which includes the second opening V_CNT, is formed, the protective layer 165 may cover inner sides of the first power line VL1, exposed by the wire opening S_CNT. Thereafter, when the protective layer 165 is removed, a part of the protective layer 165 may be recessed inwardly into the via layer 166, and the data main metal layer 141a may also be inwardly recessed into the data capping layer 142. As a result, the wire connection structure may be formed.

In an embodiment, the display device 1 may include the connection electrode PBR to prevent the data main metal layer 141a from being oxidated by the pixel-defining film PDL, which is formed after the via layer 166. The protective layer 165 may be etched to expose sides of the data main metal layer 141a, and then, the connection electrode PBR may be arranged before the formation of the pixel-defining film PDL. The connection electrode PBR may be in contact with the sides of the data main metal layer 141a and may thus cover at least parts of the sides of the data main metal layer 141a. Also, the connection electrode PBR may prevent oxidation of the data main metal layer 141a during the formation of the pixel-defining film PDL. In an embodiment, the connection electrode PBR may cover only parts of the sides of the data main metal layer 141a, but the disclosure is not limited thereto. Alternatively, the sides of the data main metal layer 141a may be fully covered by the connection electrode PBR.

In an embodiment, the display device 1 includes the wire connection structure in order for the common electrode CME to receive the low-potential voltage in the display area DA, such that the display device 1 may effectively prevent voltage drops in the low-potential voltage. In such an embodiment, as the display device 1 includes the protective layer 165, which is disposed on the data conductive layer 140, the display device 1 may prevent the data conductive layer 140 from being damaged during the formation of the wire connection structure, which is connected to the common electrode CME.

An embodiment of a method of fabricating the display device 1 will hereinafter be described.

FIGS. 9 through 18 are plan views or cross-sectional views illustrating an embodiment of a method of fabricating the display device according to an embodiment of the disclosure. FIGS. 9 through 18 illustrate processes of forming the wire connection structure of the display device 1. Specifically, FIGS. 9, 11, 13, and 16 are plan views illustrating processes of forming the wire connection structure of the display device 1, and FIGS. 10, 12, 14, 15, 17, and 18 are cross-sectional views illustrating processes of forming the wire connection structure of the display device 1.

Figure 9:
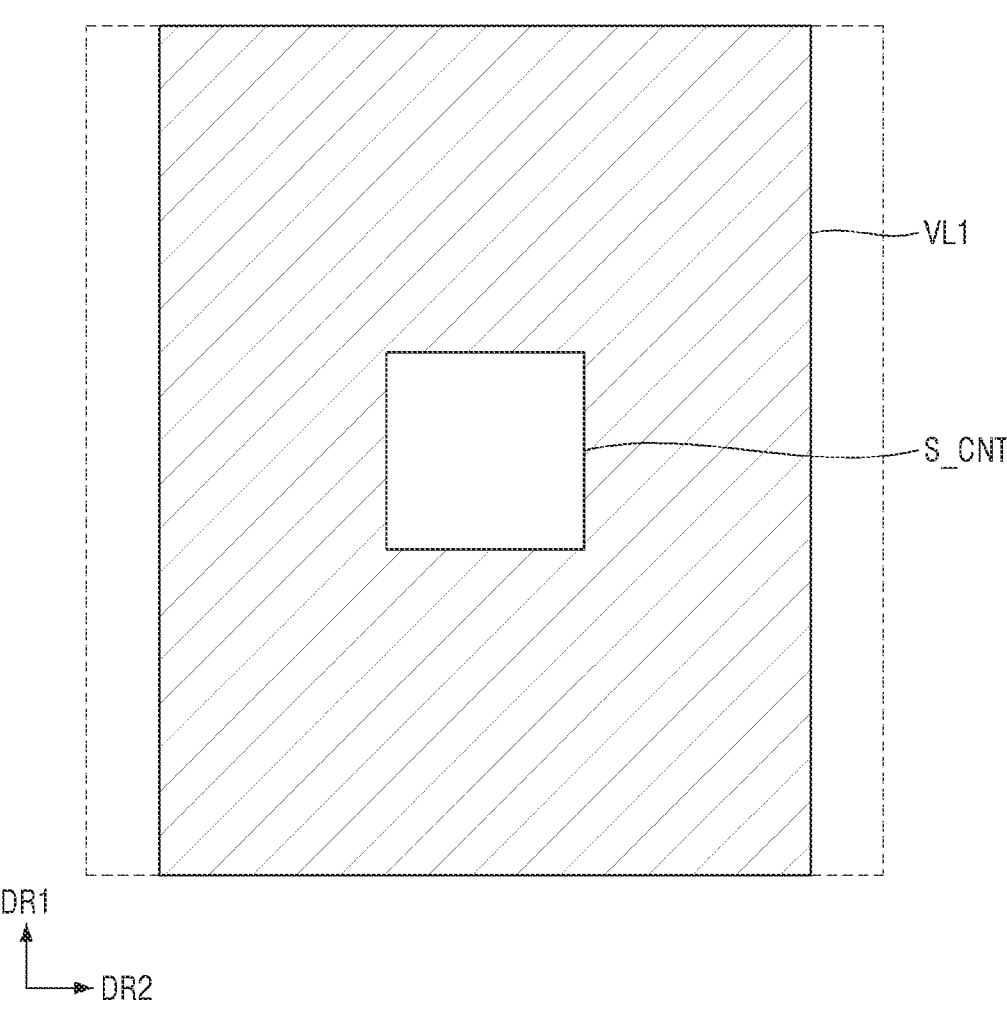
FIGS. 9 through 18 are plan views or cross-sectional views illustrating an embodiment of a method of fabricating the display device of FIG. 1.
Figure 10:
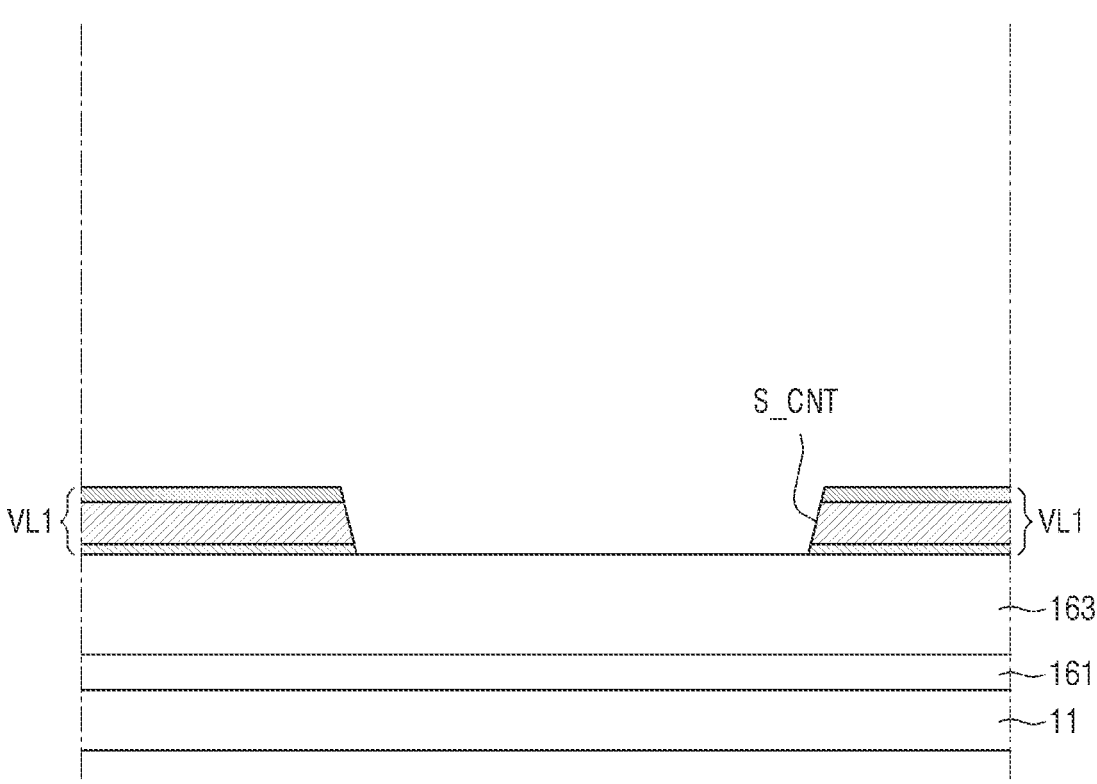

Referring to FIGS. 9 and 10, the first power line VL1, which is provided with the wire opening S_CNT, is formed on the interlayer insulating layer 163. The first power line VL1 may be disposed in the non-emission area NEM of the display area DA where no pixel electrodes PXE are disposed. The wire opening S_CNT may be formed through the first power line VL1.

The first power line VL1 may be included in the data conductive layer 140 and may include the data conductive metal layer 141 and the data capping layer 142, which is disposed on the data conductive metal layer 141. The structure of the data conductive layer 140 is the same as those described above. Sides of the data main metal layer 141a of the first power line VL1 may be exposed by the wire opening S_CNT.

Figure 11:
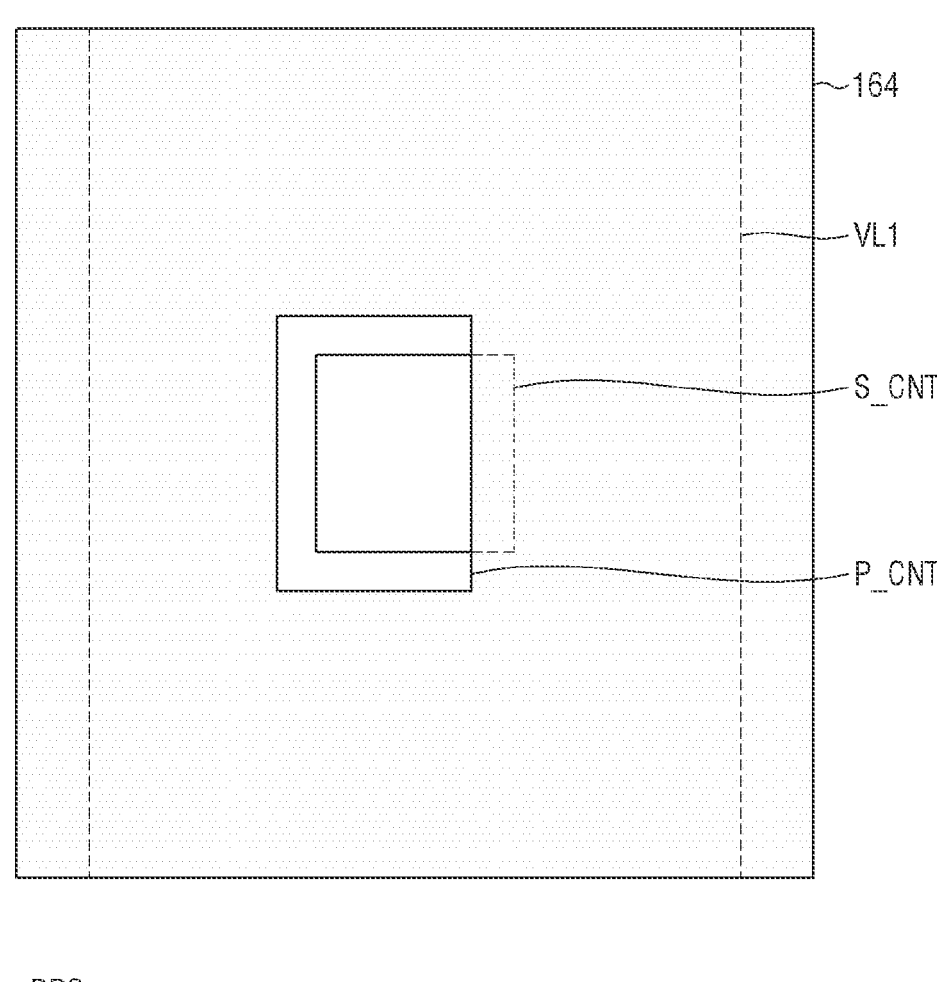
Figure 12:
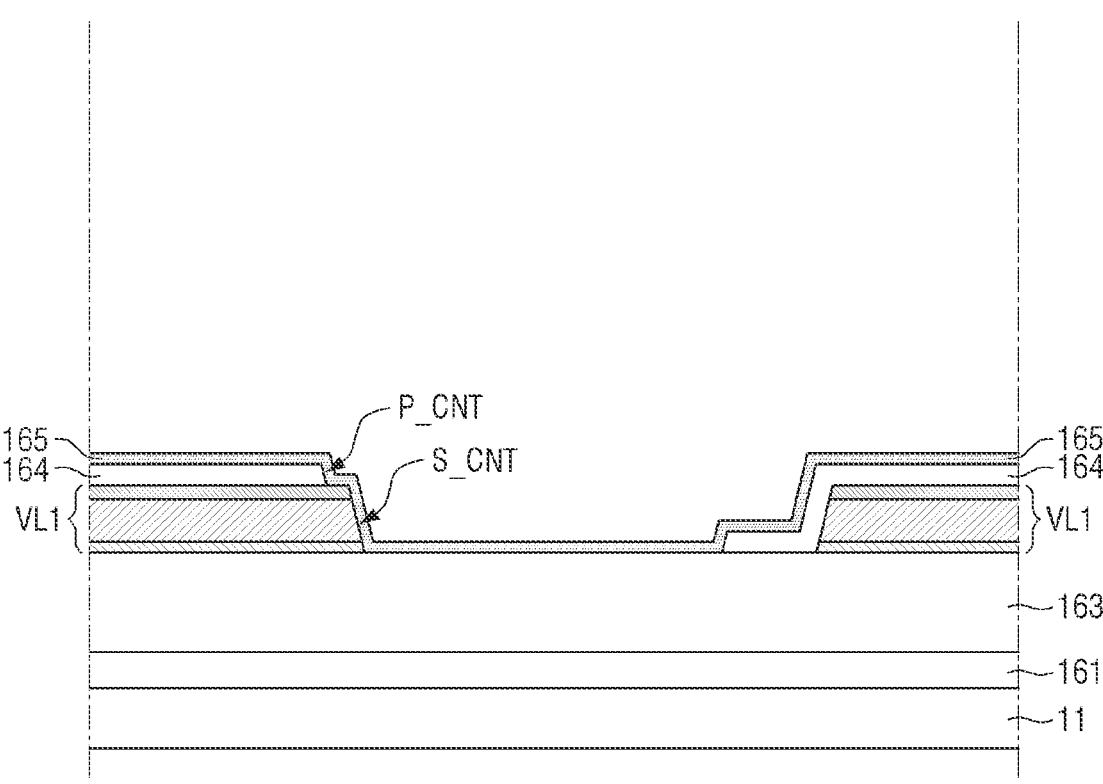

Referring to FIGS. 11 and 12, the passivation layer 164, which is provided with the first opening P_CNT, is formed on the first power line VL1, and the protective layer 165 is formed on the passivation layer 164. The first opening P_CNT may partially overlap the wire opening S_CNT. Part of the first power line VL1 that overlaps the first opening P_CNT may not be covered by the passivation layer 164, but a part of the first power line VL1 that does not overlap the first opening P_CNT may be covered by the passivation layer 164. The sides of the data main metal layer 141a may not be covered by the passivation layer 164, in part of the first power line VL1, but may be covered by the passivation layer 164, in another part of the first power line VL1.

The protective layer 165 may be disposed on the passivation layer 164, the first power line VL1, and the interlayer insulating layer 163. The protective layer 165 may be formed to fully cover the underlying layers without any contact hole defined therethrough. The part of the first power line VL1 that overlaps the first opening P_CNT may be covered by the protective layer 165. In an embodiment, for example, inner sides of the part of the first power line VL1 that overlaps the first opening P_CNT may be protected by the protective layer 165.

Figure 13:
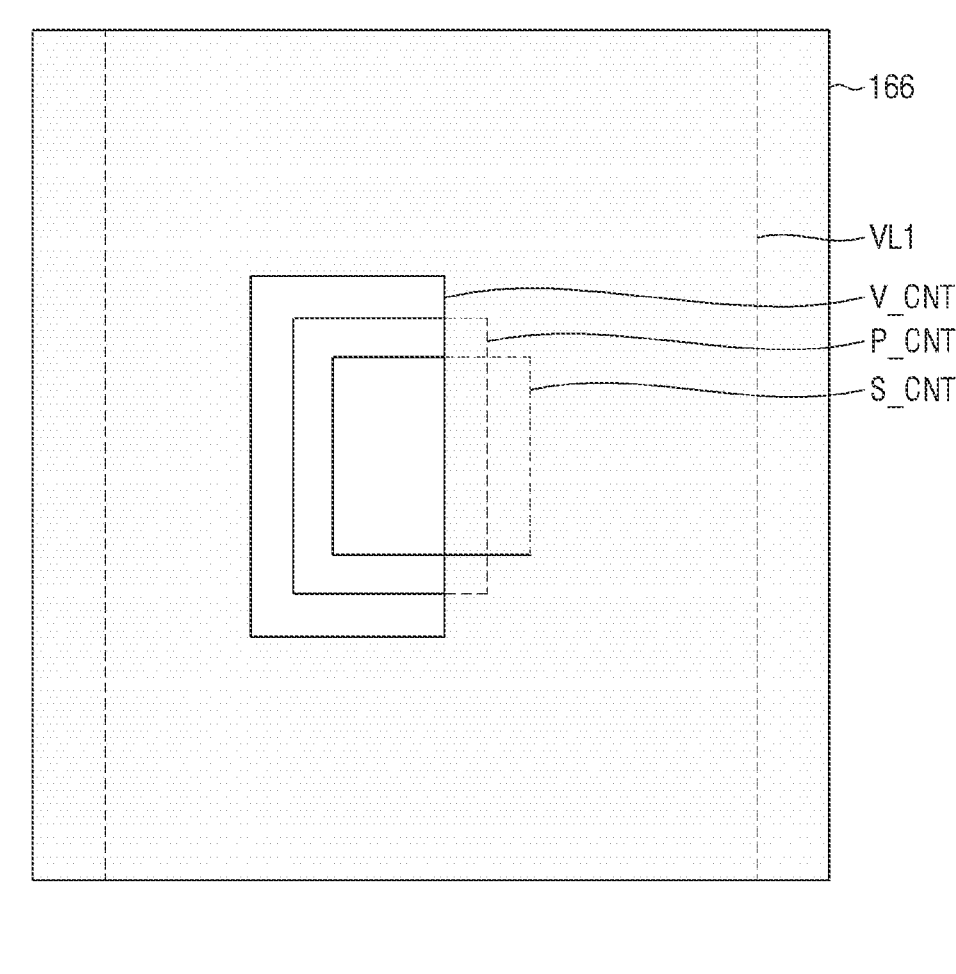
Figure 14:
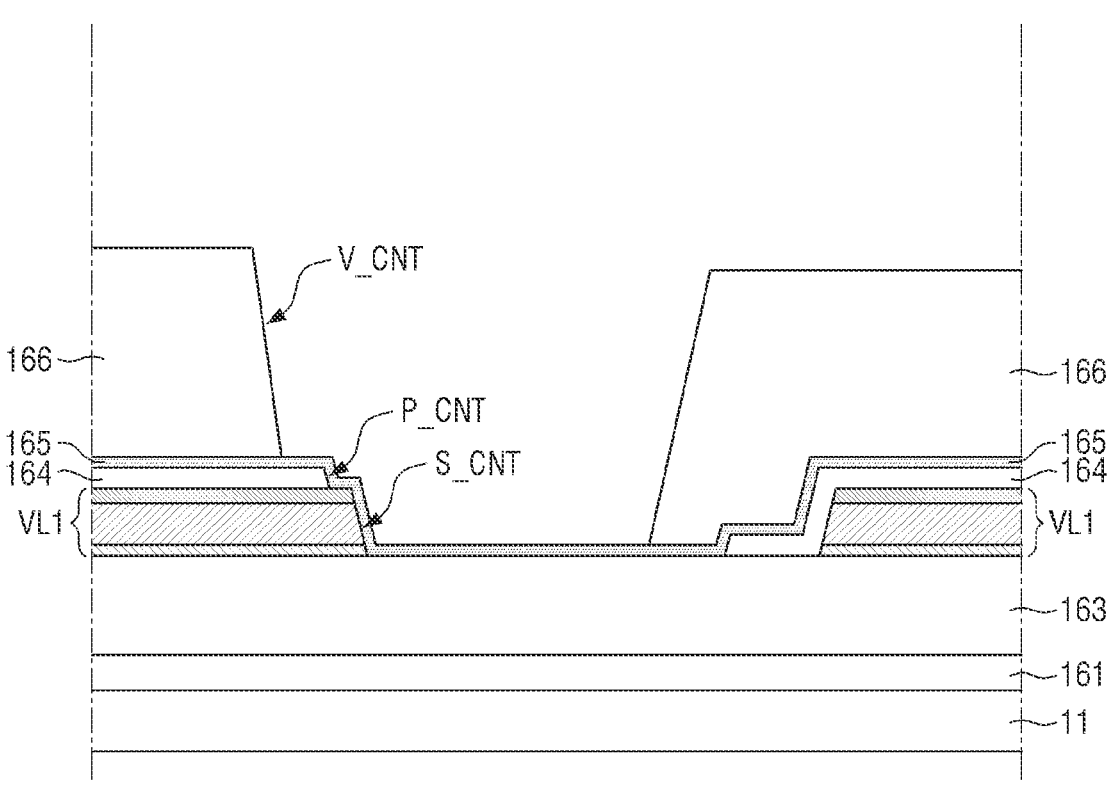
Figure 15:
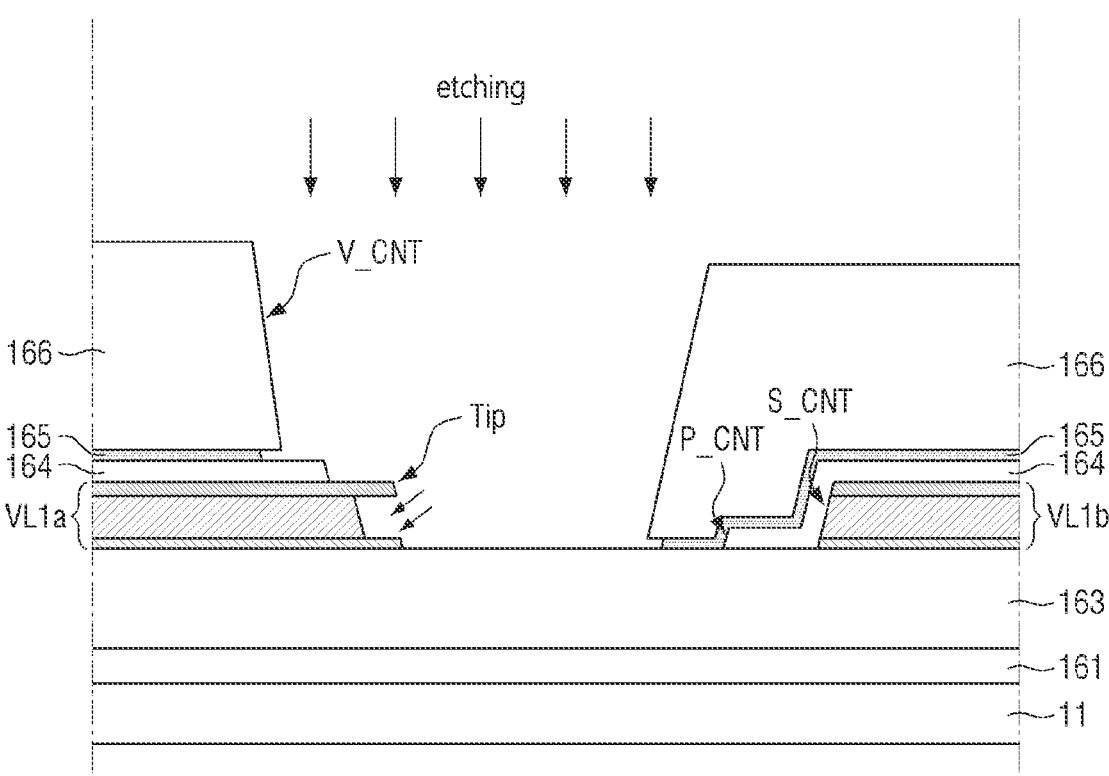

Referring to FIGS. 13 through 15, the via layer 166, which is provided with the second opening V_CNT, is formed on the protective layer 165, and the wire connection structure is formed in the first power line VL1 by etching the protective layer 165.

The second opening V_CNT may partially overlap the first opening P_CNT and the wire opening S_CNT. Part of the first power line VL1 that overlaps both the first and second openings P_CNT and V_CNT may not be covered by the passivation layer 164 and the via layer 166, but a part of the first power line VL1 that overlaps the first opening P_CNT and does not overlap the second opening V_CNT, may be covered by the via layer 166. The sides of the data main metal layer 141a may not be covered by the passivation layer 164 and the via layer 166, in part of the first power line VL1, but may be covered by at least one of the passivation layer 164 and the via layer 166, in another part of the first power line VL1.

As the via layer 166 includes an organic insulating material, the data conductive layer 140 may be exposed to moisture during the formation of the via layer 166. Particularly, the sides of the data main metal layer 141a of the first power line VL1 may be exposed by the wire opening S_CNT. However, as the display device 1 includes the protective layer 165, which prevents the data main metal layer 141a from being exposed to an organic material or moisture during the formation of the via layer 166, the display device 1 may effectively prevent oxidation of the data main metal layer 141a during the formation of the via layer 166.

Once the via layer 166 is formed, the protective layer 165 is etched using the via layer 166 as a mask, and the wire connection structure is formed in the first power line VL1. Here, the protective layer 165 may be etched by an isotropic etching process. During the isotropic etching process, part of the protective layer 165 may be recessed below the via layer 166. Also, the data main metal layer 141a may be recessed inwardly from the data capping layer 142, and the tip of the data capping layer 142 may be formed in the data conductive layer 140. The data base layer 141b may be etched slower than the data main metal layer 141a and may be projected beyond the sides of the data main metal layer 141a. The protective layer 165 may include a material that can properly protect the data main metal layer 141a and can be quickly removed. In an embodiment, for example, the protective layer 165 may include a material such as silicon oxide, silicon nitride, or silicon oxynitride.

As a result of the etching of the protective layer 165, the wire connection structure may be formed in the part of the first power line VL1 that overlaps both the first and second openings P_CNT and V_CNT, but does not overlap a part of the first power line VL1 that does not overlap at least one of the first and second openings P_CNT and V_CNT. In an embodiment, for example, a part of the first power line VL1 may become the first wire part VL1a, in which the data main metal layer 141a is recessed, and another part of the first line VL1 may become the second wire part VL1b, which has smooth sides. The sides of the first wire part VL1a may become the first sidewalls S1, and the sides of the second wire part VL1b may become the second sidewalls S2 and the third sidewall S3, which are covered by the passivation layer 164 or the via layer 166 and in which the wire connection structure is not formed.

Figure 16:
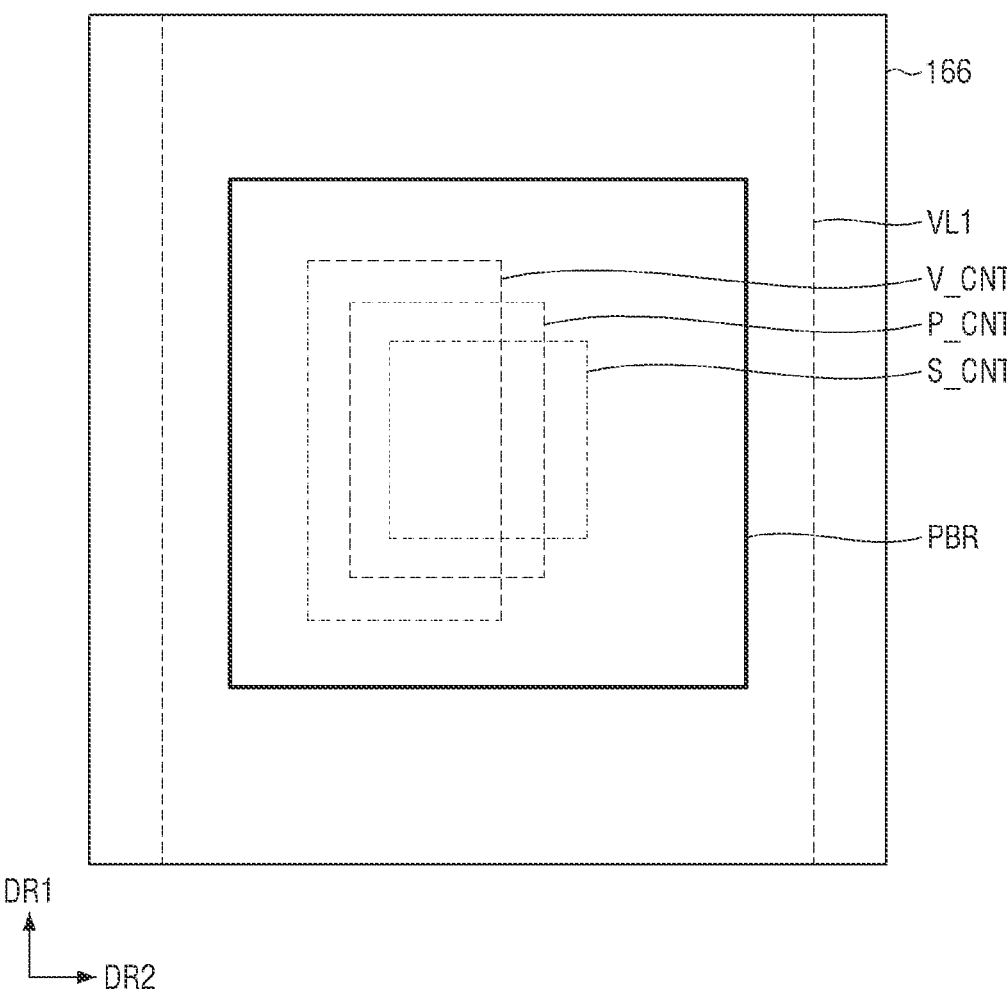
Figure 17:
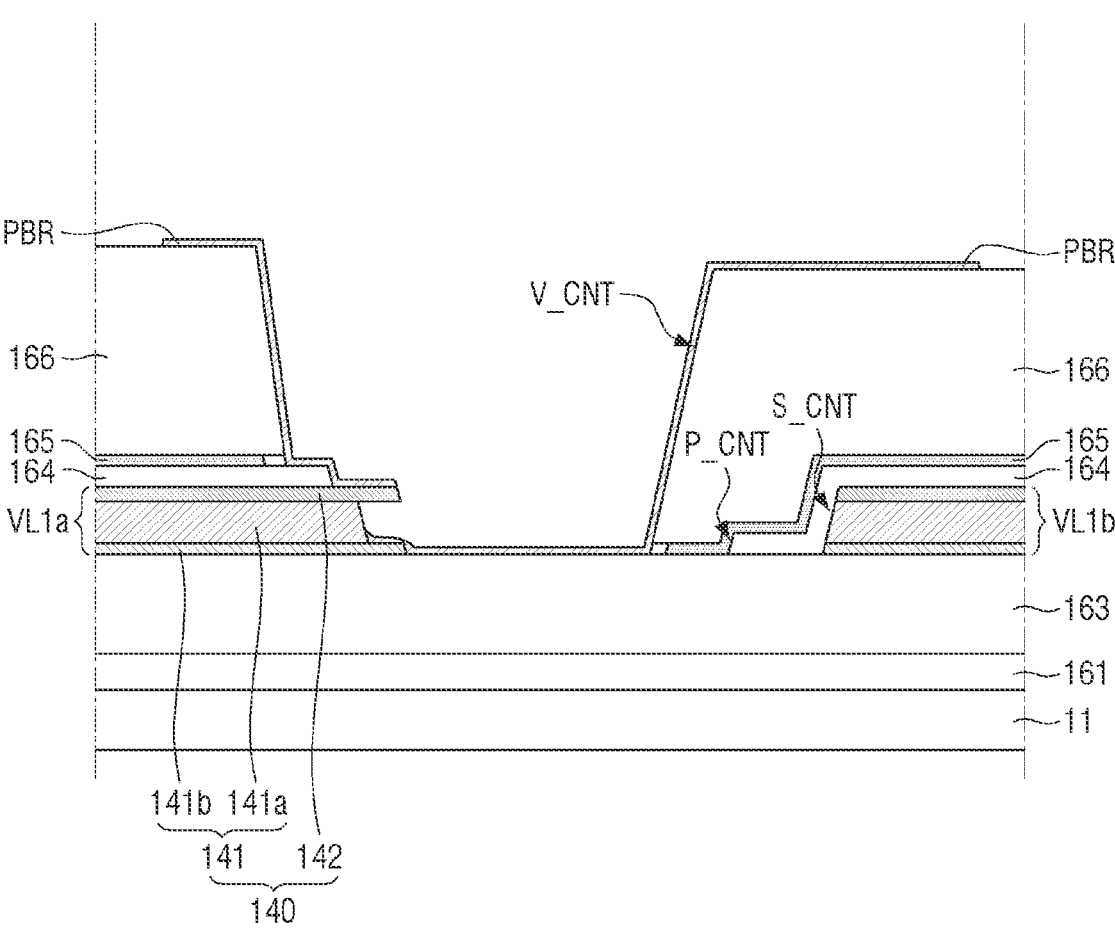
Figure 18:
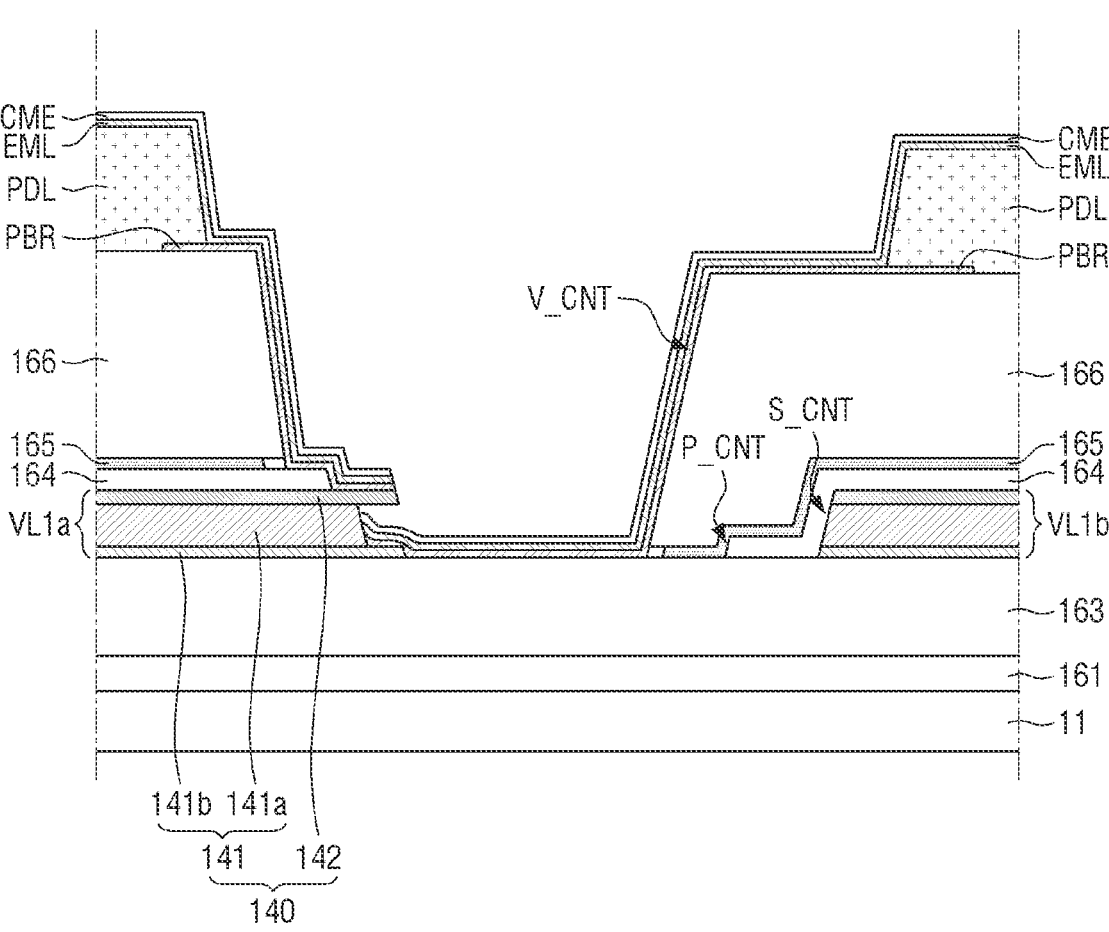

Referring to FIGS. 16 through 18, the connection electrode PBR is formed on the via layer 166, and the pixel-defining film PDL, the light-emitting layer EML, and the common electrode CME are sequentially formed.

The connection electrode PBR may be disposed in a same layer as pixel electrodes PXE and may include a same material as the pixel electrodes PXE. The connection electrode PBR may be disposed to cover the first and second openings P_CNT and V_CNT and the wiring opening S_CNT. The PBR may also cover the sides of each of eh via layer 166, the passivation layer 164, and the first wire part VL1a of the first power line VL1. Parts of the connection electrode PBR may be disposed on the sides of the data main metal layer 141a of the first wire part VL1a. In some embodiments, the connection electrode PBR may cover only parts of the sides of the data main metal layer 141a and may be disconnected by the tip of the data capping layer 142, but the disclosure is not limited thereto. As the connection electrode PBR covers at least parts of the sides of the data main metal layer 141a, the data main metal layer 141a can be prevented from being oxidized during the formation of the pixel-defining film PDL, which is disposed on the data main metal layer 141a.

The light-emitting layer EML and the common electrode CME, which are disposed on the pixel-defining film PDL, may be disposed in the entire display area DA and may cover the connection electrode PBR. The light-emitting layer EML and the common electrode CME may be disposed in part on the sides of the data main metal layer 141a of the first wire part VL1a and may also be disconnected by the tip of the data capping layer 142.

In an embodiment where the connection electrode PBR partially coves the sides of the data main metal layer 141a, at least parts of the light-emitting layer ML, and the common electrode CME may be in direct contact with the sides of the data main metal layer 141a, but the disclosure is not limited thereto. In an embodiment where the connection electrode PBR fully covers the sides of the data main metal layer 141a, the light-emitting layer ML and the common electrode CME may not be in direct contact with the sides of the data main metal layer 141a, and the common electrode CME may be electrically connected to the data main metal layer 141a via the connection electrode PBR.

In an embodiment, as the common electrode CME is disconnected by the tip of the data capping layer 142, part of the common electrode CME may remain on the tip of the data capping layer 142, and part of the common electrode CME may be electrically connected to the data main metal layer 141a below the tip of the data capping layer 142. In such an embodiment, as described above, only some of the sidewalls (or only parts of the sidewalls) defining the first power line VL1 may include the wire connection structure, and some sidewalls (or parts of some sidewalls) of the first power line VL1 may be covered by the passivation layer 164 or the via layer 166. Accordingly, part of the common electrode CME in the wire opening S_CNT may not be completely separated from part of the common electrode CME on the pixel-defining film PDL and may receive the low-potential voltage. Also, as parts of the inner sidewalls defining the wire opening S_CNT are covered by the passivation layer 164 or the via layer 166, slopes caused by the difference in height between the pixel-defining film PDL and the interlayer insulating layer 163 may be alleviated. Accordingly, the material of the common electrode CME may be effectively prevented from being disconnected by being placed in contact with the data main metal layer 141a of the data conductive layer 140, from the pixel-defining film PDL.

Display devices according to alternative embodiments of the disclosure will hereinafter be described.

Figure 19:
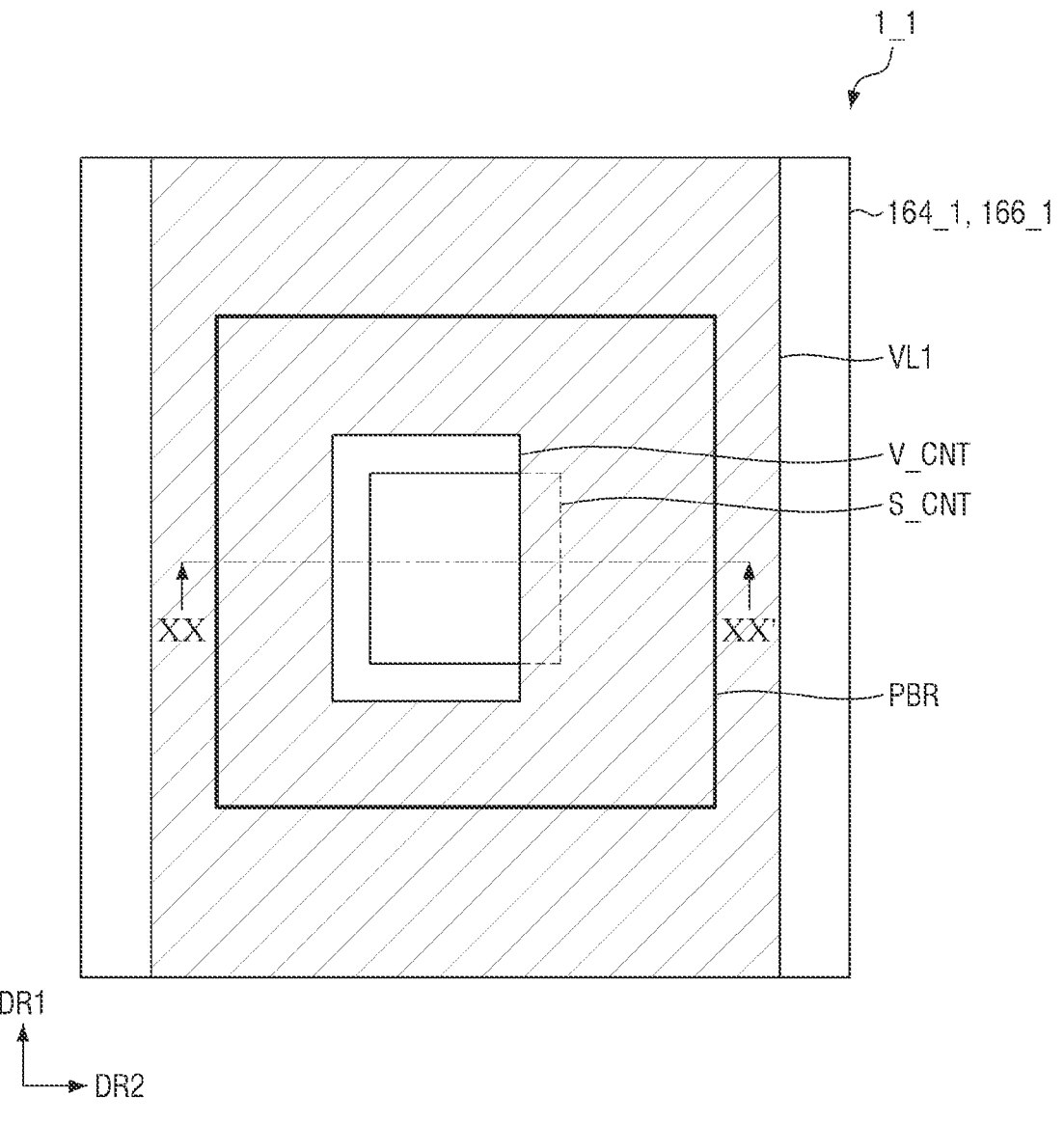
FIG. 19 is a plan view illustrating part of a power line of a display device according to an alternative embodiment of the disclosure.
Figure 20:
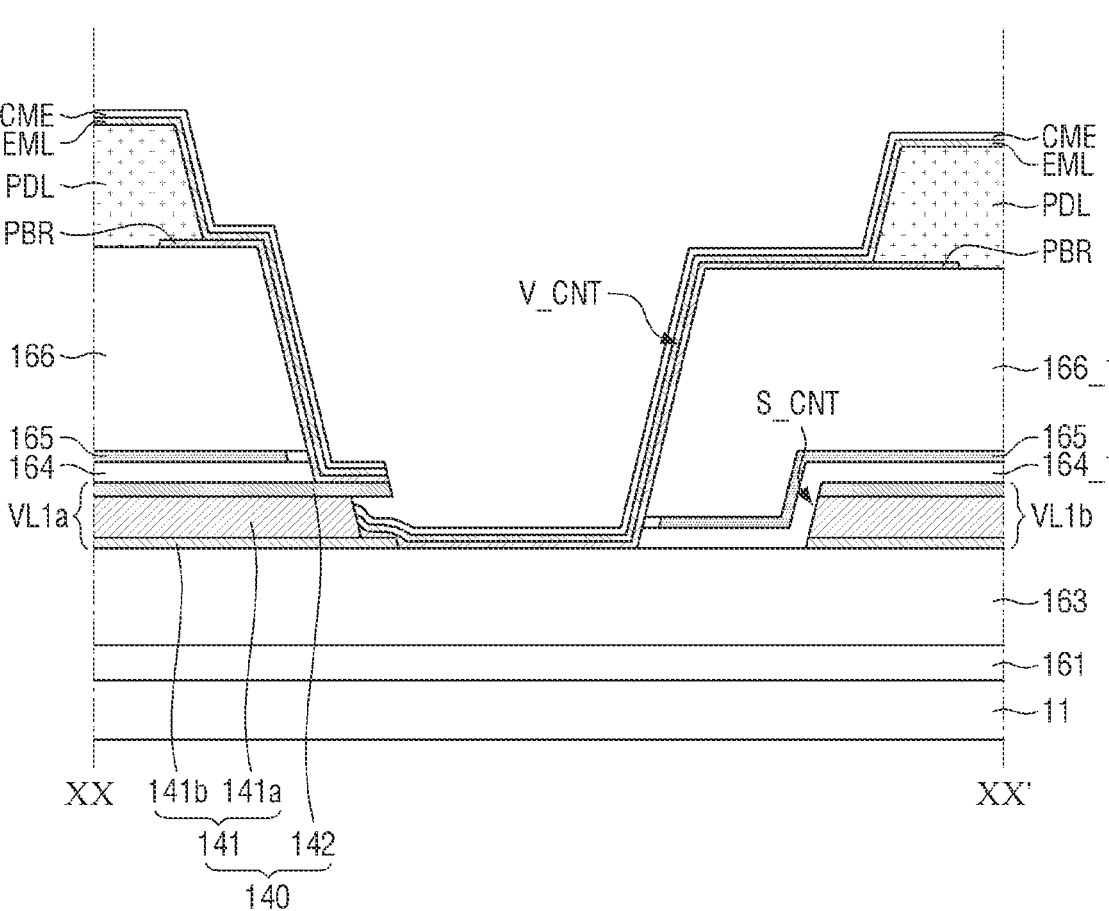
FIG. 20 is a cross-sectional view taken along line XX-XX' of FIG. 19.

FIG. 19 is a plan view illustrating part of a power line of a display device according to an alternative embodiment of the disclosure. FIG. 20 is a cross-sectional view taken along line XX-XX' of FIG. 19.

Referring to a display device 1_1 of FIGS. 19 and 20, in an embodiment, a same opening, i.e., an opening V_CNT, is defined through a passivation layer 164_1 and a via layer 166_1. The opening V_CNT may be formed through the passivation layer 164_1 during the formation of the via layer 166_1, and the inner sides of the passivation layer 164_1 may be in parallel with the inner sides of the via layer 166_1. The embodiment of FIGS. 19 and 20 is substantially the same as the embodiment of FIG. 6 except that the number of manufacturing processes can be reduced because the number of processes of forming openings can be reduced.

Figure 21:
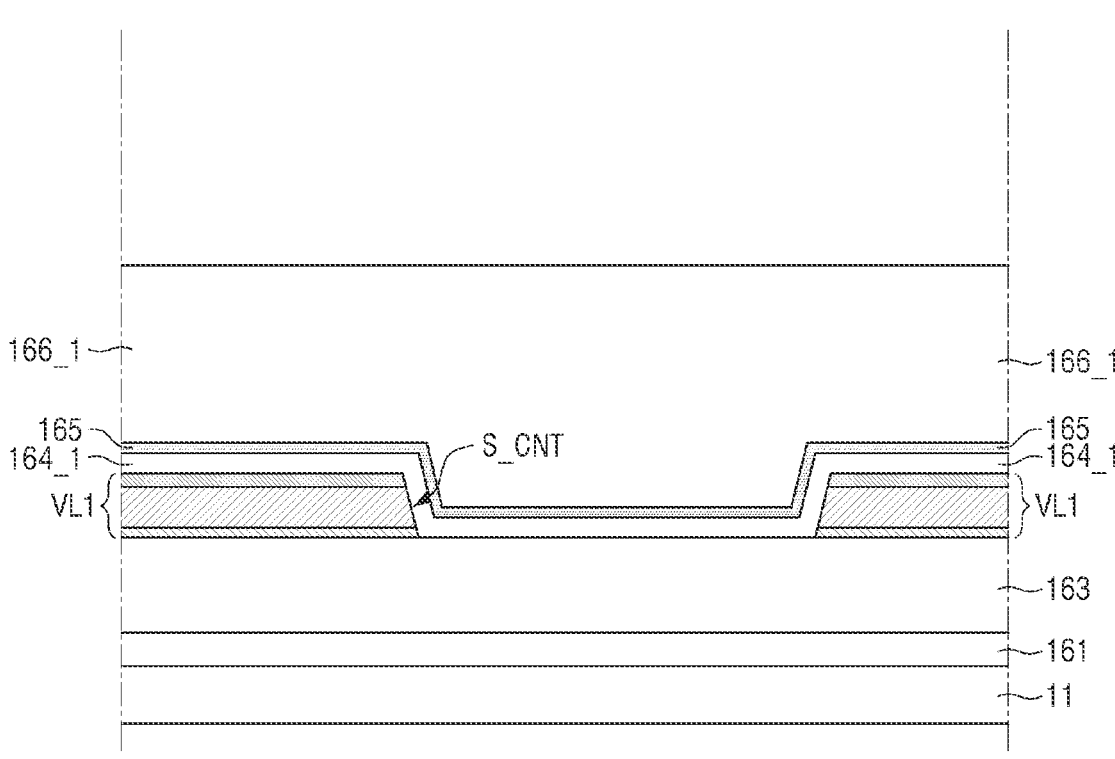
FIGS. 21 through 23 are cross-sectional views illustrating an embodiment of a method of fabricating the display device of FIG. 19.
Figure 22:
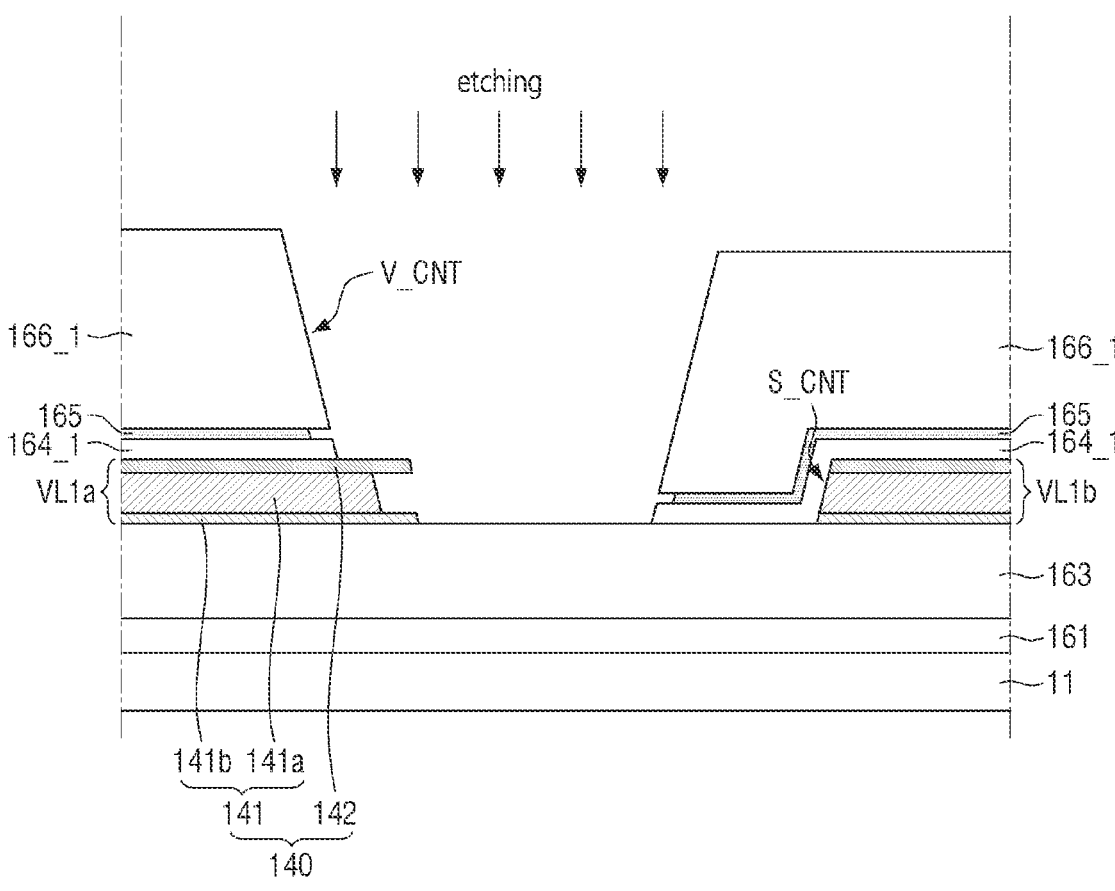
Figure 23:
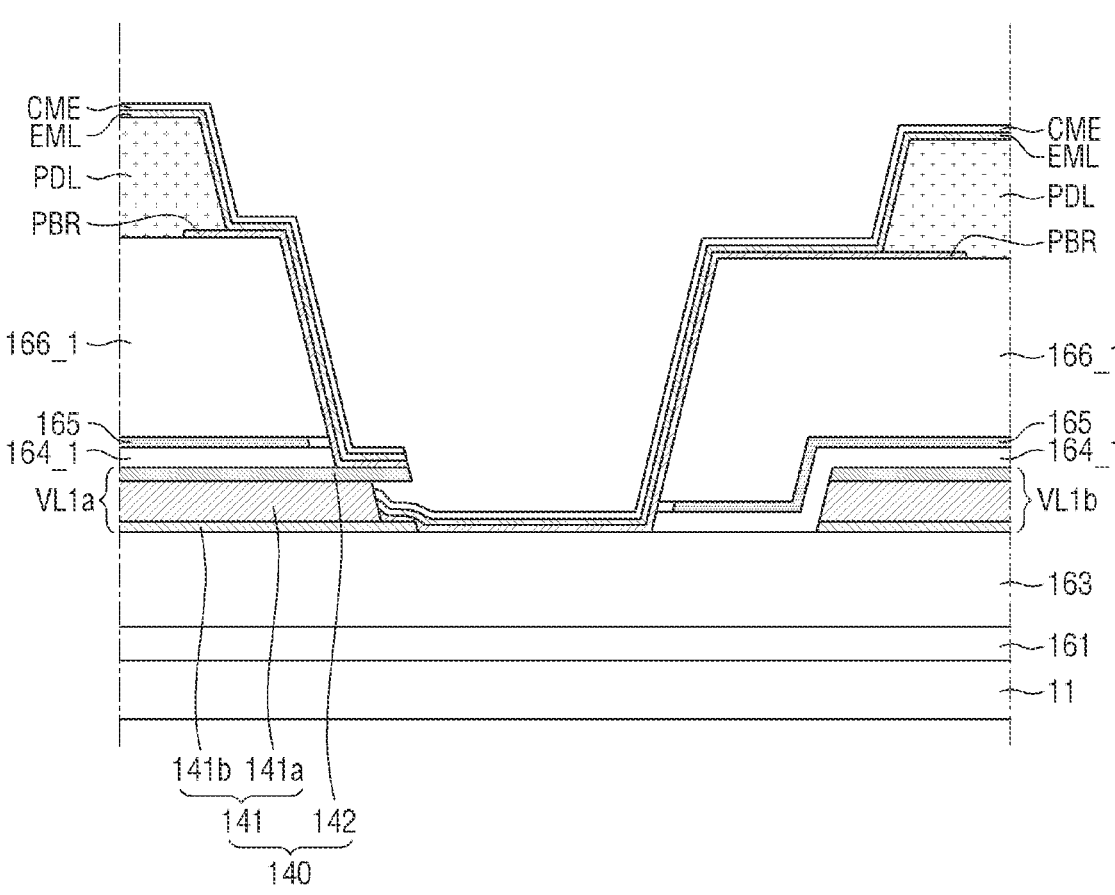

FIGS. 21 through 23 are cross-sectional views illustrating an embodiment of a method of fabricating the display device of FIG. 19.

Referring to FIGS. 21 and 22, an embodiment of the method of fabricating the display device 1_1 may include sequentially forming the passivation layer 1641, a protective layer 165, and the via layer 166_1 on a first power line VL1, which is provided with a wire opening S_CNT, and forming the opening V_CNT, which is formed through the passivation layer 1641, the protective layer 165, and the via layer 1661. Sidewalls of the wire opening S_CNT of the first power line VL1 may be protected by the passivation layer 1641. The opening V_CNT may be formed by an isotropic etching process, and the protective layer 165 may be recessed inwardly into the via layer 166_1. During the formation of the opening V_CNT, a data main metal layer 141a may be recessed in sidewalls (or parts of sidewalls) of the first power line VL1 that overlap the opening V_CNT, and as a result, a wire connection structure may be formed.

Thereafter, referring to FIG. 23, a connection electrode PBR, a light-emitting layer EML, and a common electrode CME are formed above the opening V_CNT to electrically connect the common electrode CME and the first power line VL1 of a data conductive layer 140. Accordingly, the number of processes for forming contact holes in the display device 1_1 can be reduced.

Figure 24:
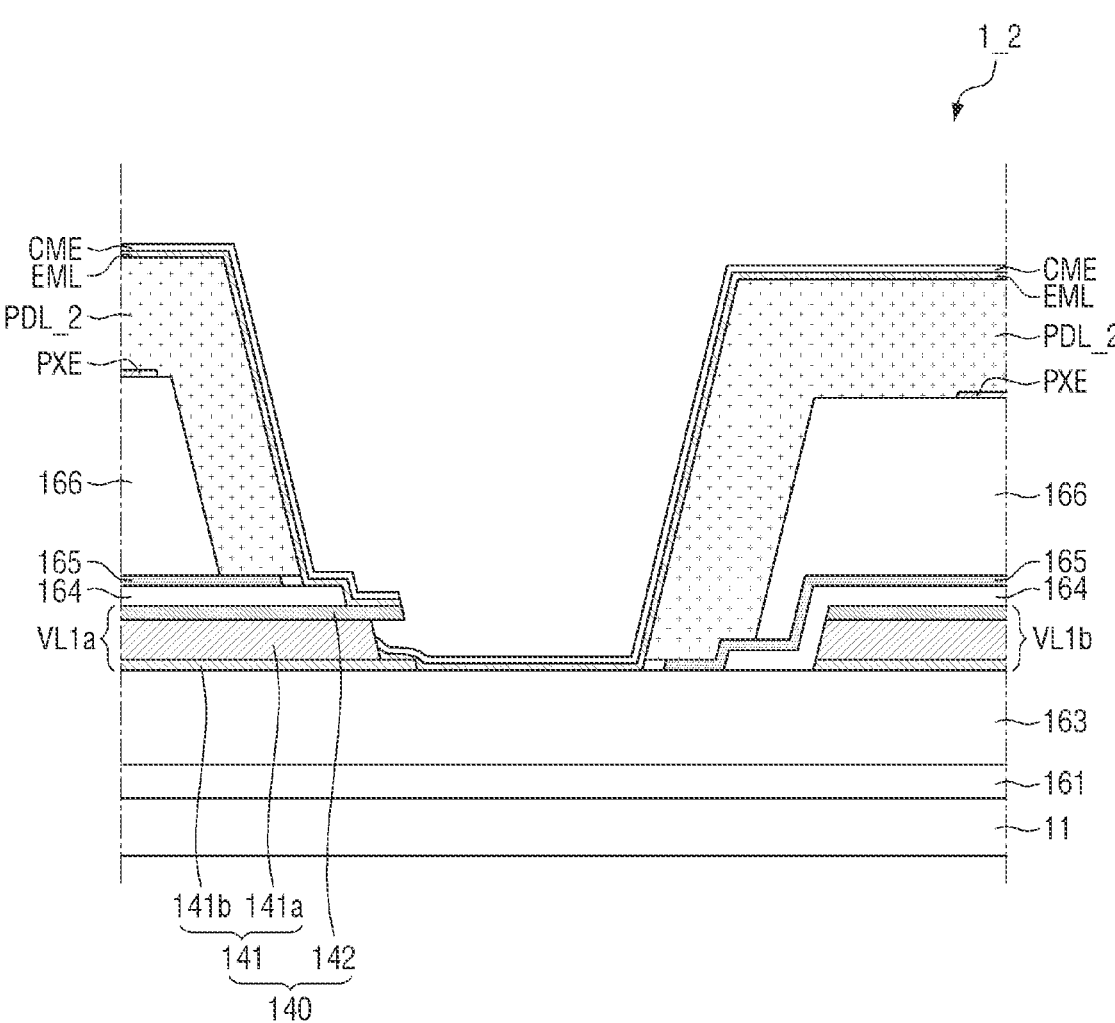
FIG. 24 is a cross-sectional view illustrating part of a power line of a display device according to another alternative embodiment of the disclosure.

FIG. 24 is a cross-sectional view illustrating part of a power line of a display device according to another alternative embodiment of the disclosure.

Referring to a display device 1_2 of FIG. 24, in an embodiment, the etching of a protective layer 165 may be performed after the formation of a pixel-defining film PDL_2. Part of the pixel-defining film PDL_2 may be disposed in a second opening V_CNT, and inner sides of a via layer 166 may be covered by the pixel-defining film PDL_2. The pixel-defining film PDL_2 may function as a mask during the etching of the protective layer 165, and part of the pixel-defining film PDL_2 may be disposed directly on the protective layer 165. As a wire connection structure is formed in a first power line VL1 after the formation of the pixel-defining film PDL_2, a connection electrode PBR may not be provided. A data main metal layer 141a with sides exposed in the first power line VL1 may be in direct contact with a light-emitting layer EML and a common electrode CME.

Figure 25:
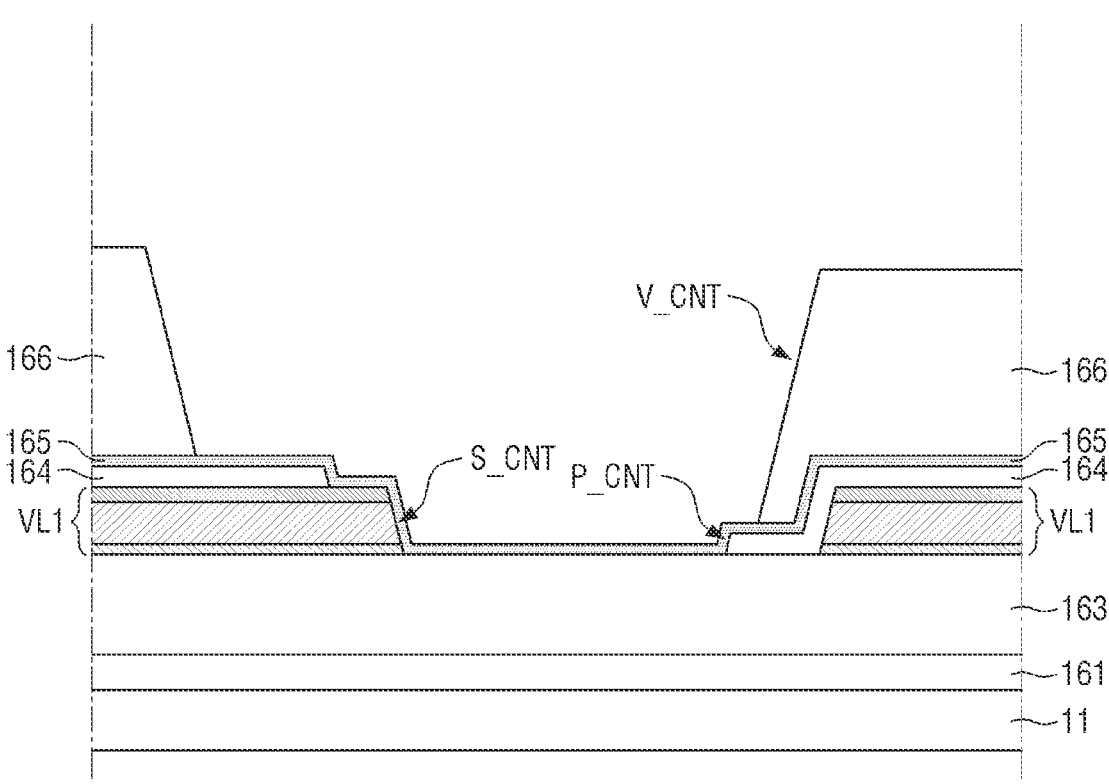
FIGS. 25 through 27 are cross-sectional views illustrating an embodiment of a method of fabricating the display device of FIG. 24.
Figure 26:
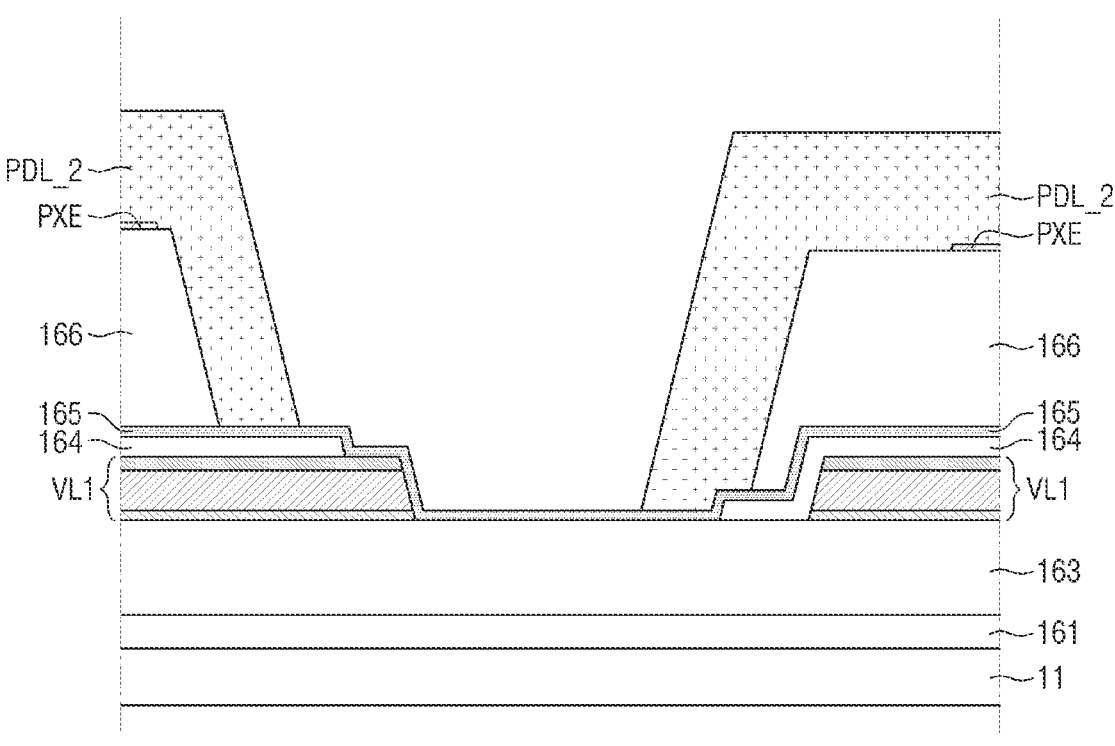
Figure 27:
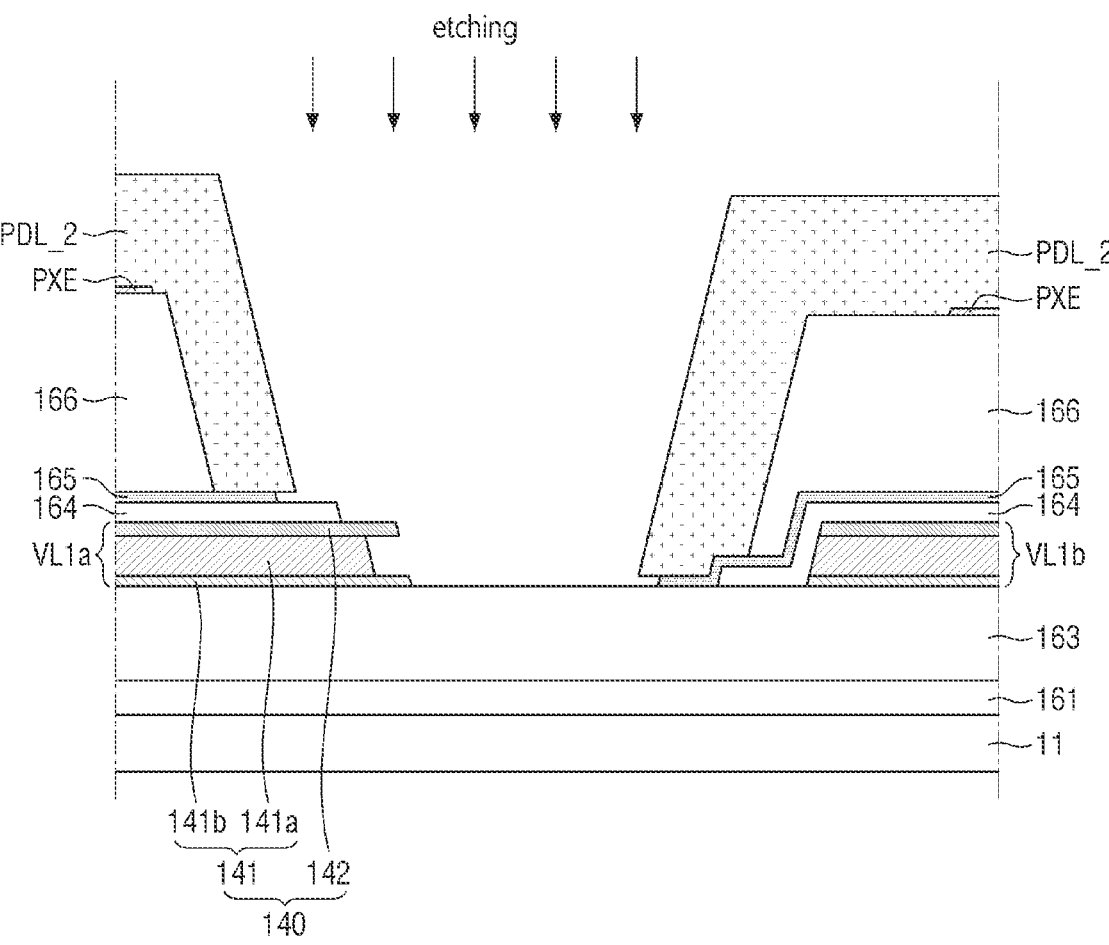

FIGS. 25 through 27 are cross-sectional views illustrating an embodiment of a method of fabricating the display device of FIG. 24.

Referring to a display device 1_2 of FIGS. 25 and 26, in an embodiment, a passivation layer 164 and the via layer 166, which are provided with a first opening P_CNT and the second opening V_CNT, respectively, are formed, and a pixel-defining film PDL_2 is formed without etching a protective layer 165. Part of the pixel-defining film PDL_2 may be disposed in the second opening V_CNT, and the first opening P_CNT and part of the protective layer 165 may be exposed. As sides of the first power line VL1 are protected by the protective layer 165 during the formation of the pixel-defining film PDL_2, oxidation of the data main metal layer 141a can be prevented.

Thereafter, referring to FIG. 27, the protective layer 165 is etched using the pixel-defining film PDL_2 as a mask, and the wire connection structure is formed in the first power line VL1. Thereafter, the light-emitting layer EML and the common electrode CME may be formed to electrically connect the common electrode CME and the first power line VL1.

As the wire connection structure is formed after the formation of the pixel-defining film PDL_2, a connection electrode PBR may not be provided. Also, as the pixel-defining film PDL_2 is disposed in part in the first and second openings P_CNT and V_CNT, slopes caused by the difference in height between the pixel-defining film PDL and an interlayer insulating layer 163 can be alleviated. Accordingly, the material of the common electrode CME can be prevented from being disconnected on the pixel-defining film PDL_2.

In embodiments described above, the first power line VL1 may be provided with the wire opening S_CNT, and the wire connection structure may be formed on the inner side sidewalls of the wire opening S_CNT. In an alternative, the wire connection structure may not be formed through the wire opening S_CNT as long as the common electrode CME can be electrically connected to the first power line VL1. In an embodiment, for example, the wire connection structure may be formed on a side of the first power line VL1 that extends in one direction. In an alternative embodiment, for example, the first power line VL1 may be divided into two sub-power lines, and the wire connection structure may be formed on sides of the two sub-power lines.

Figure 28:
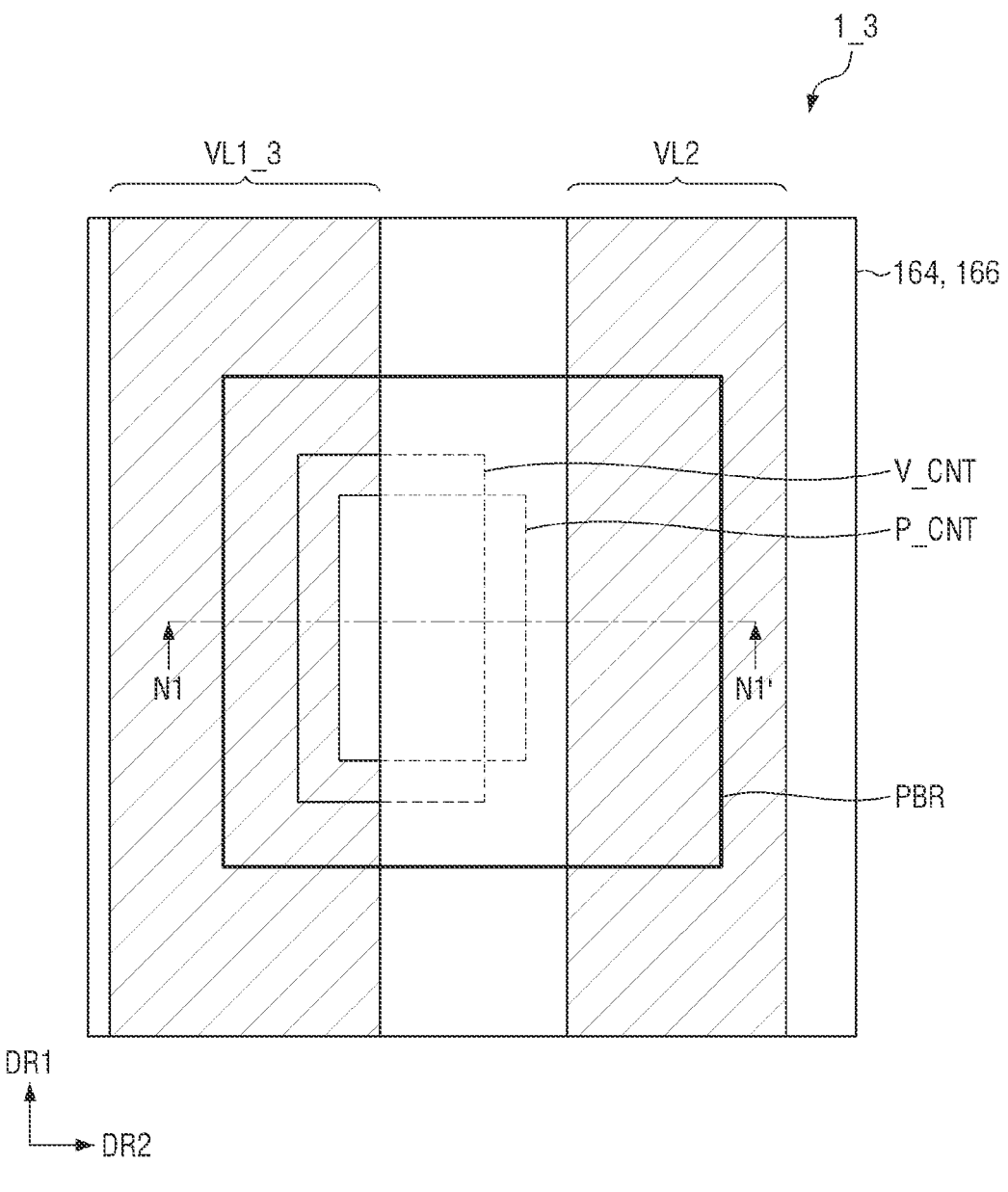
FIG. 28 is a plan view illustrating part of a power line of a display device according to another alternative embodiment of the disclosure.
Figure 29:
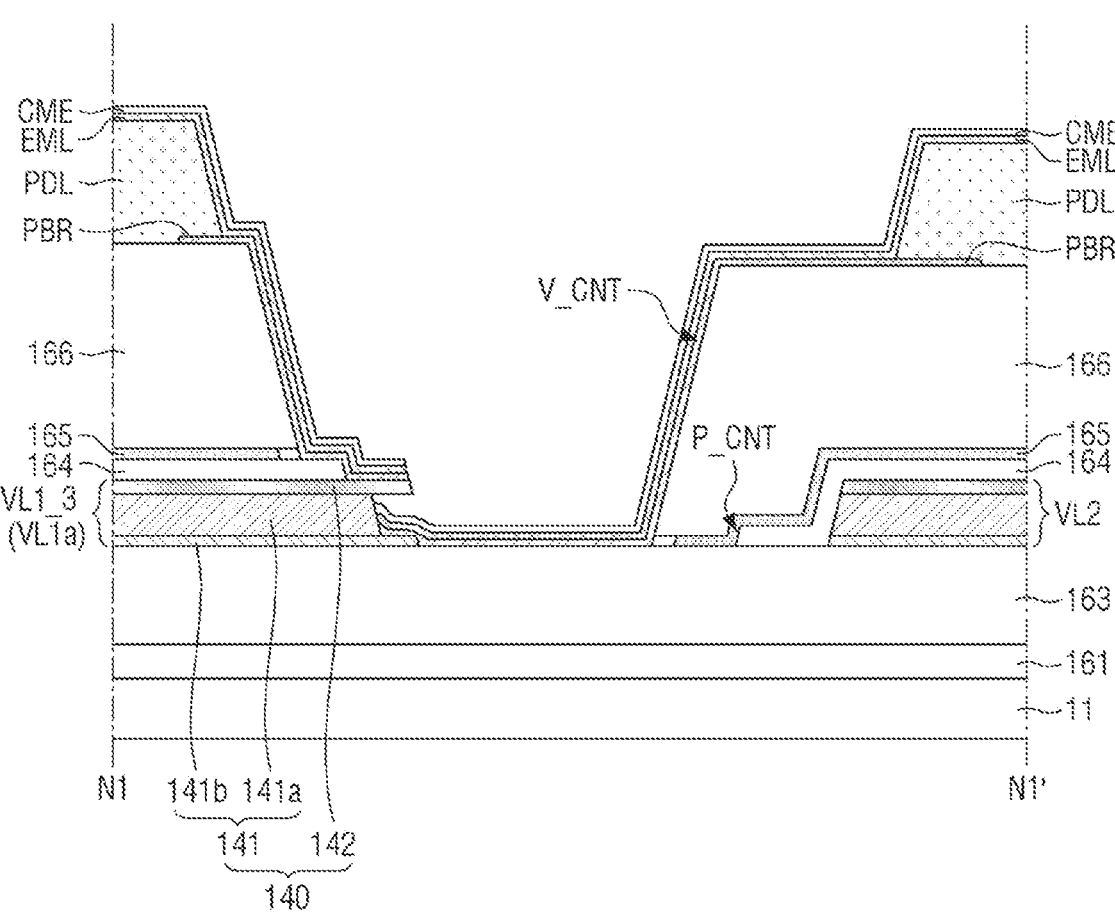
FIG. 29 is a cross-sectional view taken along line N1-N1' of FIG. 28.

FIG. 28 is a plan view illustrating part of a power line of a display device according to another alternative embodiment of the disclosure, and FIG. 29 is a cross-sectional view taken along line N1-N1' of FIG. 28.

Referring to FIGS. 28 and 29, an embodiment of a display device 13 may include a first power line VL1_3 and a second power line VL2, which is spaced apart from the first power line VL1_3, and a wire connection structure may be disposed on a side of the first power line VL1_3 that faces the second power line VL2. A first opening P_CNT of a passivation layer 164 may overlap the side of the first power line VL1_3, but may not overlap the second power line VL2. A second opening V_CNT of a via layer 166 may overlap the side of the first power line VL1_3, but may not overlap the second power line VL2. A wire connection structure may be formed on the side of the first power line VL1_3 that overlaps the first and second opening P_CNT and V_CNT. In an embodiment, for example, a part of the first power line VL1_3 that overlaps the first and second openings P_CNT and V_CNT may be a first wire part VL1a, and the remaining part of the first power line VL1_3 may be a second wire part. On the side of the first power line VL1_3, a data main metal layer 141*a* may be partially recessed, and a tip of a data capping layer 142 may be formed.

The passivation layer 164 and the via layer 166 may be disposed to cover the second power line VL2. The second power line VL2 may not be exposed by the first and second openings P_CNT and V_CNT, and sides of the second power line VL2 may be smooth due to the wire connection structure not being formed thereon. Even though a common electrode CME is disposed on the second power line VL2, the second power line VL2, which is covered by the passivation layer 164, may not be electrically connected to the common electrode CME. The common electrode CME may be electrically connected to the first power line VL1_3 via the wire connection structure, which is formed on the side of the first power line VL1_3, and may thus receive the low-potential voltage.

In an embodiment of the display device 13, the first power line VL1_3 may not be provided with a wire opening S_CNT, and may include the wire connection structure on its side facing another power line in a data conductive layer 140. The other power line that faces the first power line VL1_3 may be the second power line VL2, but the disclosure is not limited thereto. That is, the second power line VL2 is merely exemplary, and the wire connection structure may be formed between the first power line VL1_3 and another element, other than a power line (e.g., a conductive pattern or an electrode), disposed in the data conductive layer 140 together with the first power line VL1_3.

Figure 30:
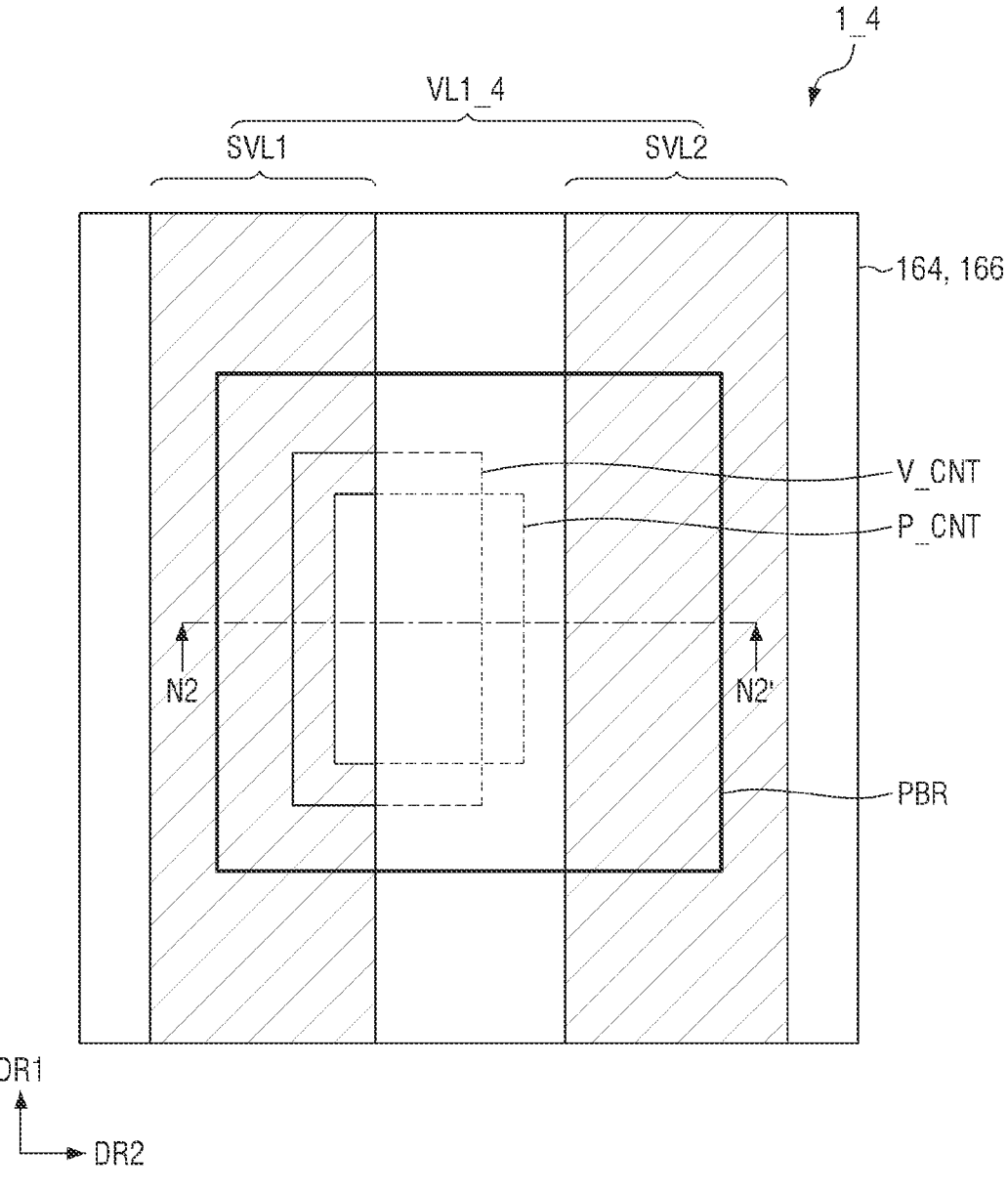
FIG. 30 is a plan view illustrating part of a power line of a display device according to another alternative embodiment of the disclosure.
Figure 31:
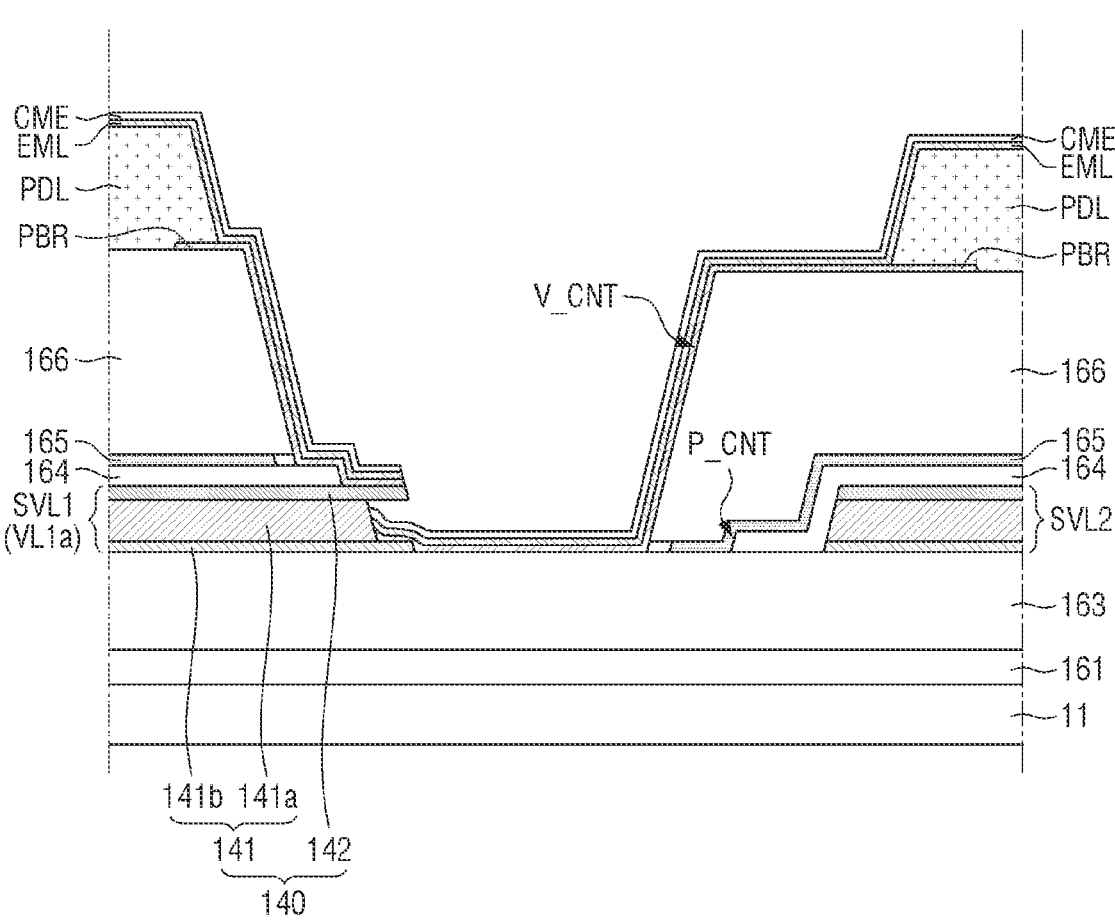
FIG. 31 is a cross-sectional view taken along line N2-N2' of FIG. 30.

FIG. 30 is a plan view illustrating part of a power line of a display device according to another alternative embodiment of the disclosure. FIG. 31 is a cross-sectional view taken along line N2-N2' of FIG. 30.

Referring to FIGS. 30 and 31, an embodiment of a display device 1_4 may include a first power line VL1_4, which is divided into a plurality of first and second sublines SVL1 and SVL2 that are spaced apart from each other, and a wire connection structure may be formed on a side of one of the first and second sublines SVL1 and SVL2.

The first power line VL1_4 may include the first and second sublines SVL1 and SVL2. The first and second sublines SVL1 and SVL2 may be lines, to which low-potential voltages are applied. In an embodiment, the first power line VL1_4 may include first and second sublines SVL1 and SVL2 that extend from a non-display area NDA, but the disclosure is not limited thereto. Alternatively, one first power line VL1_4 may be provided and extend, and may branch into the first and second sublines SVL1 and SVL2. In such an embodiment, the first and second sublines SVL1 and SVL2 may be spaced apart from each other in an area where the wire connection structure is formed, and may be connected to each other or integrated together into the first power line VL1_4 in another area.

The wire connection structure may be disposed on a side of the first subline SVL1 that faces the second subline SVL2. A first opening P_CNT of a passivation layer 164 may overlap the side of the first subline SVL1, but may not overlap the second subline SVL2. A second opening V_CNT of a via layer 166 may overlap the side of the first subline SVL1, but may not overlap the second line SVl2. The wire connection structure may be formed on part of the first subline SVL1 that overlaps with both the first and second openings P_CNT and V_CNT. In an embodiment, for example, the part of the first subline SVL1 that overlaps with both the first and second openings P_CNT and V_CNT may be a first wire part VL1*a*, and the rest of the first subline SVL1 may be a second wire part. On the side of the first subline SVL1, a data main metal layer 141*a* may be partially recessed, and a tip of a data capping layer 142 may be formed.

The passivation layer 164 and the via layer 166 may be disposed to cover the second subline SVL2. The second subline SVL2 may not be exposed by the first and second openings P_CNT and V_CNT, and sides of the second subline SVL2 may be smooth due to the wire connection structure not being formed thereon. Even though a common electrode CME is disposed on the second subline SVL2, the second subline SVL2, which is covered by the passivation layer 164, may not be electrically connected to the common electrode CME. The common electrode CME may be electrically connected to the first power line VL1_4 via the wire connection structure, which is formed on the side of the first subline SVL1, and may thus receive a low-potential voltage.

Figure 32:
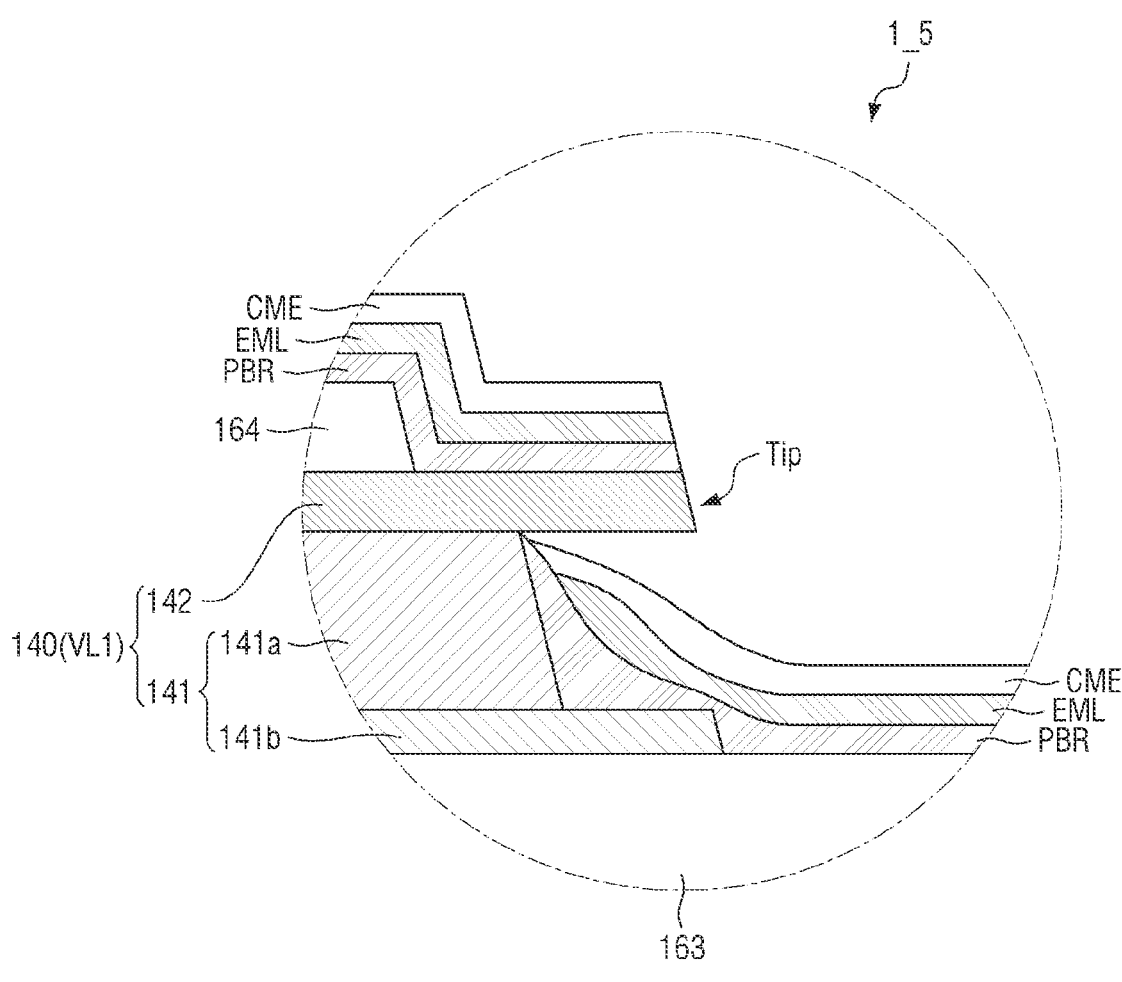
FIG. 32 is a cross-sectional view illustrating a wire connection structure of a display device according to another alternative embodiment of the disclosure.

FIG. 32 is a cross-sectional view illustrating a wire connection structure of a display device according to another alternative embodiment of the disclosure. Specifically, FIG. 32 is an enlarged view of a portion of a display device 1_5 corresponding to FIG. 8.

Referring to the display device 1_5 of FIG. 32, in an embodiment, a connection electrode PBR may be disposed to fully cover sides of a data main metal layer 141*a* of a data conductive layer 140. In an embodiment, as described above, the area of the connection electrode PRB on exposed sides of the data main metal layer 141*a* may vary depending on how to form the connection electrode PBR or the process spread during the formation of the connection electrode PBR. In an embodiment, as shown in FIG. 32, the exposed sides of the data main metal layer 141*a* may be fully covered and protected by the connection electrode PBR. A common electrode CME and a light-emitting layer EML may be disposed on the connection electrode PBR, on the sides of the data main metal layer 141*a*. The common electrode CME may be electrically connected to the data main metal layer 141*a* and a first power line VL1 via the connection electrode PBR.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a data conductive layer including a first power line, which is disposed on a substrate;
   a passivation layer disposed on the data conductive layer, wherein a first opening, which exposes at least part of the first power line, is defined through the passivation layer;
   a protective layer disposed on the passivation layer;
   a via layer disposed on the protective layer, wherein a second opening, which partially overlaps with the first opening, is defined through the via layer;
   a pixel electrode disposed on the via layer;
   a connection electrode spaced apart from the pixel electrode and disposed, at least in part, in the first and second openings;

a pixel-defining film disposed on the pixel electrode and the connection electrode, wherein an opening, which overlaps the second opening, is defined through the pixel-defining film;

a light-emitting layer disposed on the pixel-defining film, and at least in part, on the pixel electrode and the connection electrode; and a common electrode disposed on the light-emitting layer and electrically connected to the first power line, wherein the data conductive layer includes a data base layer, a data main metal layer, which is disposed on the data base layer, and a data capping layer, which is disposed on the data main metal layer, the first power line includes a wire connection structure, in which the data main metal layer is recessed from sides of the data capping layer, and the common electrode is electrically connected to the data main metal layer in the wire connection structure.

2. The display device of claim 1, wherein the protective layer is recessed in part from sidewalls of the pixel-defining film defining the second opening, below the via layer.

3. The display device of claim 2, wherein the protective layer includes silicon oxide, silicon nitride, or silicon oxynitride.

4. The display device of claim 1, wherein the connection electrode is disposed, at least in part, on sides of the data main metal layer.

5. The display device of claim 1, wherein the first power line includes:

first sidewalls, which overlap the first and second openings and on which the wire connection structure is disposed;

second sidewalls, which overlap the first opening, and does not overlap the second opening, and are covered by the passivation layer; and a third sidewall, which does not overlap the first and second openings and is covered by the via layer.

6. The display device of claim 5, wherein the second sidewalls and the third sidewall of the first power line are aligned with sides of the data main metal layer and the sides of the data capping layer.

7. The display device of claim 1, wherein the connection electrode is disposed to cover sides of the data main metal layer.

8. The display device of claim 1, wherein a wire opening is defined through the first power line, and the first and second openings are disposed to partially overlap the wire opening.

9. The display device of claim 8, wherein the wire connection structure is disposed on first sidewalls overlapping the first and second openings among sidewalls of the wire opening.

10. The display device of claim 9, wherein sidewalls of the wire opening which do not overlap at least one selected from the first and second openings are covered by the passivation layer or the via layer and are in aligned with sides of the data main metal layer and the sides of the data capping layer.

11. The display device of claim 1, further comprising:

a second power line spaced apart from the first power line, wherein the first and second openings overlap a side of the first power line, and do not overlap the second power line.

12. The display device of claim 11, wherein the wire connection structure overlaps the first and second openings of the first power line.

13. The display device of claim 1, wherein the first power line includes first and second sublines, which are spaced apart, at least in part, from each other, and the first and second openings overlap a side of the first subline, and do not overlap the second subline.

14. The display device of claim 13, wherein the wire connection structure is disposed on a part of the first subline which overlaps the first and second openings.

15. A display device comprising:

a data conductive layer including a first power line, which is disposed on a substrate;

a passivation layer disposed on the data conductive layer, wherein a first opening, which exposes at least part of the first power line, defined through the passivation layer;

a protective layer disposed on the passivation layer;

a via layer disposed on the protective layer, wherein a second opening, which partially overlaps the first opening, is defined through the via layer;

a pixel electrode disposed on the via layer;

a pixel-defining film disposed on the pixel electrode, wherein an opening, which overlaps the second opening, is defined through the pixel-defining film;

a light-emitting layer disposed on the pixel-defining film, and at least in part, on the pixel electrode and a connection electrode; and a common electrode disposed on the light-emitting layer and electrically connected to the first power line, wherein the data conductive layer includes a data base layer, a data main metal layer, which is disposed on the data base layer, and a data capping layer, which is disposed on the data main metal layer, the protective layer is recessed inwardly below the pixel-defining film, the first power line includes a wire connection structure, in which the data main metal layer is recessed from sides of the data capping layer, and the common electrode is electrically connected to the data main metal layer in the wire connection structure.

* * * * *